(12) United States Patent
Weinstein et al.

(10) Patent No.: US 11,536,747 B2
(45) Date of Patent: Dec. 27, 2022

(54) CURRENT TRANSFORMER WITH SELF-ADJUSTING CORES

(71) Applicant: Sense Labs, Inc., Cambridge, MA (US)

(72) Inventors: Jeffrey Jay Weinstein, Mansfield, MA (US); John Andrew Watlington, Acton, MA (US); Joseph Louis Bamberg, Reading, MA (US); Walter L. Xu, Somerville, MA (US)

(73) Assignee: Sense Labs, Inc., Cambridge, MA (US)

( * ) Notice: Subject to any disclaimer, the term of this patent is extended or adjusted under 35 U.S.C. 154(b) by 128 days.

(21) Appl. No.: 16/858,897

(22) Filed: Apr. 27, 2020

(65) Prior Publication Data
US 2021/0011056 A1 Jan. 14, 2021

Related U.S. Application Data

(60) Provisional application No. 62/873,132, filed on Jul. 11, 2019.

(51) Int. Cl.
*G01R 15/18* (2006.01)
*H01F 38/00* (2006.01)
(Continued)

(52) U.S. Cl.
CPC ....... *G01R 15/186* (2013.01); *G01R 19/0092* (2013.01); *H01F 19/04* (2013.01);
(Continued)

(58) Field of Classification Search
CPC ... G01R 15/186; G01R 19/0092; H01F 19/04; H01F 27/02; H01F 27/027; H01F 27/24; H05K 5/0004; H05K 5/0221; H05K 5/023
See application file for complete search history.

(56) References Cited

U.S. PATENT DOCUMENTS

| 3,263,021 | A | 7/1966 | Alan |
| D248,851 | S | 8/1978 | Langlie et al. |

(Continued)

FOREIGN PATENT DOCUMENTS

| CA | 2802915 A1 | 12/2011 |
| CN | 101083586 A | 12/2007 |

(Continued)

OTHER PUBLICATIONS

"Chapter 8 Remote OS Detection", Nmap Network Scanning, https://nmap.org/book/osdetect.html (accessed Mar. 13, 2017), 6 pages.

(Continued)

*Primary Examiner* — Dominic E Hawkins
(74) *Attorney, Agent, or Firm* — GTC Law Group PC & Affiliates

(57) ABSTRACT

A current transformer includes a first housing including a first handle portion and a first distal portion, a second housing including a second handle portion and a second distal portion, a first core having a first proximal core end and a first distal core end the first core mounted in rotational contact within the first distal portion, and a second core having a second proximal core end and a second distal core end, the second core mounted in rotational contact within the second distal portion, wherein the first housing is rotationally coupled to the second housing about a fulcrum point.

20 Claims, 9 Drawing Sheets

(51) Int. Cl.
 *H05K 5/02* (2006.01)
 *G01R 19/00* (2006.01)
 *H01F 27/24* (2006.01)
 *H05K 5/00* (2006.01)
 *H01F 27/02* (2006.01)
 *H01F 19/04* (2006.01)

(52) U.S. Cl.
 CPC ........... *H01F 27/02* (2013.01); *H01F 27/027* (2013.01); *H01F 27/24* (2013.01); *H01F 38/00* (2013.01); *H05K 5/0004* (2013.01); *H05K 5/023* (2013.01); *H05K 5/0221* (2013.01)

(56) References Cited

U.S. PATENT DOCUMENTS

| | | | |
|---|---|---|---|
| 4,316,142 | A | 2/1982 | Kuramoto |
| D274,614 | S | 7/1984 | Fallon et al. |
| D313,791 | S | 1/1991 | Matsui |
| 5,162,772 | A | 11/1992 | May |
| 5,945,993 | A | 8/1999 | Fleischmann |
| 6,311,105 | B1 | 10/2001 | Budike |
| 7,085,814 | B1 | 8/2006 | Gandhi et al. |
| D534,120 | S | 12/2006 | Ricci et al. |
| D550,619 | S | 9/2007 | Ricci et al. |
| 7,353,182 | B1 | 4/2008 | Missinhoun et al. |
| D610,541 | S | 2/2010 | Mueller et al. |
| 7,884,598 | B2 | 2/2011 | Wang et al. |
| 8,239,073 | B2 | 8/2012 | Fausak et al. |
| 8,674,823 | B1 | 3/2014 | Contario et al. |
| 8,760,151 | B2 | 6/2014 | Mcbee et al. |
| 8,930,152 | B2 | 1/2015 | Patel et al. |
| 9,057,746 | B1 | 6/2015 | Houlette et al. |
| 9,152,737 | B1 | 10/2015 | Micali et al. |
| 9,172,623 | B1 | 10/2015 | Micali et al. |
| 9,355,000 | B1 | 5/2016 | Biswas et al. |
| 9,429,599 | B1 | 8/2016 | Contario et al. |
| 9,443,195 | B2 | 9/2016 | Micali et al. |
| 9,691,030 | B2 | 6/2017 | Micali et al. |
| 9,699,529 | B1 | 7/2017 | Petri et al. |
| 9,735,588 | B2 | 8/2017 | Gilbert et al. |
| 9,739,813 | B2 | 8/2017 | Houlette et al. |
| 9,800,958 | B1 | 10/2017 | Petri et al. |
| 9,942,630 | B1 | 4/2018 | Petri et al. |
| 9,958,925 | B2 | 5/2018 | Chapel et al. |
| 10,001,792 | B1 | 6/2018 | Packer et al. |
| 10,175,276 | B2 | 1/2019 | Fishburn et al. |
| 10,338,112 | B2 | 7/2019 | Micali et al. |
| D873,126 | S | 1/2020 | Tang |
| 10,586,177 | B1 | 3/2020 | Choueiter et al. |
| 10,735,829 | B2 | 8/2020 | Petri et al. |
| 10,740,691 | B2 | 8/2020 | Choueiter et al. |
| 10,750,252 | B2 | 8/2020 | Petri et al. |
| 10,809,286 | B2 | 10/2020 | Micali et al. |
| 10,878,343 | B2 | 12/2020 | Choueiter et al. |
| 11,146,868 | B2 | 10/2021 | Petri et al. |
| 11,182,699 | B2 | 11/2021 | Choueiter et al. |
| D944,731 | S | 3/2022 | Weinstein et al. |
| 2002/0178047 | A1 | 11/2002 | Or et al. |
| 2003/0216971 | A1 | 11/2003 | Sick et al. |
| 2004/0142662 | A1 | 7/2004 | Ehrenberg et al. |
| 2004/0255171 | A1 | 12/2004 | Zimmer et al. |
| 2005/0034023 | A1 | 2/2005 | Maturana et al. |
| 2005/0085973 | A1 | 4/2005 | Furem et al. |
| 2005/0108582 | A1 | 5/2005 | Fung et al. |
| 2006/0155514 | A1 | 7/2006 | Drouart et al. |
| 2006/0235574 | A1 | 10/2006 | Lapinski et al. |
| 2008/0306985 | A1 | 12/2008 | Murray et al. |
| 2009/0058399 | A1* | 3/2009 | Wang ............... G01R 1/22 324/127 |
| 2009/0222360 | A1 | 9/2009 | Schmitt et al. |
| 2010/0211222 | A1 | 8/2010 | Ghosn et al. |
| 2010/0217550 | A1 | 8/2010 | Crabtree et al. |
| 2010/0332373 | A1 | 12/2010 | Crabtree et al. |
| 2011/0066300 | A1 | 3/2011 | Tyagi et al. |
| 2011/0245987 | A1 | 10/2011 | Pratt et al. |
| 2012/0022713 | A1 | 1/2012 | Deaver et al. |
| 2012/0065802 | A1 | 3/2012 | Seeber et al. |
| 2012/0181869 | A1 | 7/2012 | Chapel et al. |
| 2012/0197448 | A1 | 8/2012 | Shin et al. |
| 2012/0197560 | A1 | 8/2012 | Kuhns et al. |
| 2012/0221718 | A1 | 8/2012 | Imes et al. |
| 2012/0239773 | A1 | 9/2012 | Blustein et al. |
| 2012/0278272 | A1 | 11/2012 | Kim et al. |
| 2012/0280833 | A1 | 11/2012 | Jonsson et al. |
| 2012/0290230 | A1 | 11/2012 | Berges Gonzalez et al. |
| 2012/0290239 | A1 | 11/2012 | Ku et al. |
| 2012/0319675 | A1* | 12/2012 | El-Essawy ............ G01R 35/02 324/74 |
| 2013/0066479 | A1 | 3/2013 | Shetty et al. |
| 2013/0076343 | A1 | 3/2013 | Carpenter et al. |
| 2013/0132009 | A1 | 5/2013 | Rolia et al. |
| 2013/0183043 | A1 | 7/2013 | Elberbaum |
| 2013/0241746 | A1 | 9/2013 | Mckinley et al. |
| 2013/0262197 | A1 | 10/2013 | Kaulgud et al. |
| 2013/0268357 | A1 | 10/2013 | Heath et al. |
| 2014/0052304 | A1 | 2/2014 | Vuppala et al. |
| 2014/0188565 | A1 | 7/2014 | Dantressangle et al. |
| 2014/0207255 | A1 | 7/2014 | Tandon et al. |
| 2014/0214729 | A1 | 7/2014 | Lin et al. |
| 2014/0266784 | A1 | 9/2014 | Ratcliff |
| 2014/0278241 | A1 | 9/2014 | Jiang et al. |
| 2014/0303796 | A1 | 10/2014 | Jeong et al. |
| 2015/0012147 | A1 | 1/2015 | Haghighat-Kashani et al. |
| 2015/0094968 | A1 | 4/2015 | Jia et al. |
| 2015/0112906 | A1 | 4/2015 | Gauthier et al. |
| 2015/0127185 | A1 | 5/2015 | Behrangrad |
| 2015/0142695 | A1 | 5/2015 | He et al. |
| 2015/0149128 | A1 | 5/2015 | Baone et al. |
| 2015/0161020 | A1 | 6/2015 | Matsuoka et al. |
| 2015/0204558 | A1 | 7/2015 | Sartain et al. |
| 2015/0244121 | A1 | 8/2015 | Amelio et al. |
| 2015/0261944 | A1 | 9/2015 | Hosom et al. |
| 2015/0271557 | A1 | 9/2015 | Tabe |
| 2015/0271575 | A1 | 9/2015 | Asao et al. |
| 2015/0324696 | A1 | 11/2015 | Hirschbold et al. |
| 2016/0093297 | A1 | 3/2016 | Deisher et al. |
| 2016/0132772 | A1 | 5/2016 | Little |
| 2016/0139575 | A1 | 5/2016 | Funes |
| 2016/0146866 | A1 | 5/2016 | Houlette et al. |
| 2016/0147243 | A1 | 5/2016 | Micali et al. |
| 2016/0148099 | A1 | 5/2016 | Micali et al. |
| 2016/0195864 | A1 | 7/2016 | Kim |
| 2016/0313744 | A1 | 10/2016 | Amelio et al. |
| 2016/0328651 | A1 | 11/2016 | Micali et al. |
| 2016/0336745 | A1 | 11/2016 | Pandya et al. |
| 2016/0369777 | A1 | 12/2016 | Chiang et al. |
| 2017/0045560 | A1 | 2/2017 | Rice |
| 2017/0082992 | A1 | 3/2017 | Riley et al. |
| 2017/0086143 | A1 | 3/2017 | Steinhauer et al. |
| 2017/0134182 | A1 | 5/2017 | Davis et al. |
| 2017/0176502 | A1 | 6/2017 | Saneyoshi et al. |
| 2017/0176503 | A1 | 6/2017 | Saneyoshi et al. |
| 2017/0192042 | A1 | 7/2017 | Micali et al. |
| 2018/0196094 | A1 | 7/2018 | Fishburn et al. |
| 2018/0238933 | A1 | 8/2018 | Lachman et al. |
| 2018/0242056 | A1 | 8/2018 | Petri et al. |
| 2018/0269634 | A1 | 9/2018 | Tompkins |
| 2018/0343507 | A1 | 11/2018 | Petri et al. |
| 2019/0346484 | A1* | 11/2019 | Worones ............ G01R 15/14 |
| 2020/0011901 | A1 | 1/2020 | Lin |
| 2020/0075235 | A1* | 3/2020 | Montenegro ........... H01F 38/30 |
| 2020/0104756 | A1 | 4/2020 | Choueiter et al. |
| 2020/0107085 | A1 | 4/2020 | Choueiter et al. |
| 2020/0107086 | A1 | 4/2020 | Choueiter et al. |
| 2020/0212667 | A1 | 7/2020 | Marin Perez et al. |
| 2020/0329287 | A1 | 10/2020 | Petri et al. |
| 2020/0400729 | A1 | 12/2020 | Micali et al. |
| 2021/0011057 | A1 | 1/2021 | Watlington |
| 2021/0048459 | A1 | 2/2021 | Micali et al. |
| 2021/0081845 | A1 | 3/2021 | Choueiter et al. |
| 2021/0293863 | A1 | 9/2021 | Micali et al. |
| 2021/0293864 | A1 | 9/2021 | Micali et al. |

(56) References Cited

U.S. PATENT DOCUMENTS

| | | | |
|---|---|---|---|
| 2021/0392417 A1 | 12/2021 | Petri et al. | |
| 2022/0044154 A1 | 2/2022 | Choueiter et al. | |
| 2022/0044155 A1 | 2/2022 | Choueiter et al. | |
| 2022/0044156 A1 | 2/2022 | Choueiter et al. | |
| 2022/0044157 A1 | 2/2022 | Choueiter et al. | |
| 2022/0044158 A1 | 2/2022 | Choueiter et al. | |
| 2022/0044159 A1 | 2/2022 | Choueiter et al. | |
| 2022/0044160 A1 | 2/2022 | Choueiter et al. | |
| 2022/0044161 A1 | 2/2022 | Choueiter et al. | |

FOREIGN PATENT DOCUMENTS

| | | | |
|---|---|---|---|
| CN | 101241367 A | 8/2008 | |
| CN | 102098323 A | 6/2011 | |
| CN | 102314547 A | 1/2012 | |
| CN | 102549521 A | 7/2012 | |
| CN | 102822639 A | 12/2012 | |
| CN | 104885406 A | 9/2015 | |
| CN | 104897978 A | 9/2015 | |
| CN | 105119882 A | 12/2015 | |
| DE | 202018002755 U1 | 8/2018 | |
| EP | 2570775 A1 | 3/2013 | |
| EP | 3370070 A1 | 9/2018 | |
| JP | 2010213411 A | 9/2010 | |
| JP | 2012016270 A | 1/2012 | |
| JP | 2014072561 A | 4/2014 | |
| JP | 2014086995 A | 5/2014 | |
| JP | 2015060453 A | 3/2015 | |
| JP | 2015136254 A | 7/2015 | |
| KR | 1020100111170 A | 10/2010 | |
| KR | 101448683 B1 | 10/2014 | |
| WO | 2011002735 A1 | 1/2011 | |
| WO | 2011029137 A2 | 3/2011 | |
| WO | 2012106709 A2 | 8/2012 | |
| WO | 2013022035 A1 | 2/2013 | |
| WO | 2013106923 A1 | 7/2013 | |
| WO | 2013179671 A1 | 12/2013 | |
| WO | 2015073997 A2 | 5/2015 | |
| WO | 2016081510 A1 | 5/2016 | |
| WO | 2016085500 A1 | 6/2016 | |
| WO | 2016085942 A1 | 6/2016 | |
| WO | 2018156546 A1 | 8/2018 | |
| WO | 2020072490 A1 | 4/2020 | |

OTHER PUBLICATIONS

"DC Electric Power", http://hyperphysics.phy-astr.gsu.edu/hbase/electric/elepow.html, (accessed on Aug. 5, 2016), 1 Page.

"Host Discovery, Chapter 15. Nmap Reference Guide", Nmap Network Scanning, https://nmap.org/book/man-host-discovery.html (accessed Mar. 13, 2017), 9 pages.

"Simple Service Discovery Protocol", Wikipedia, https://en.wikipedia.org/wiki/Simple_Service_Discovery_Protocol (accessed on Mar. 13, 2017), 3 pages.

14906856.1, "European Application Serial No. 14906856.1, Extended European Search Report dated Mar. 16, 2018", Sense Labs., Inc., 8 pages.

15863620.9, "European Application Serial No. 15863620.9, Extended European Search Report dated Oct. 17, 2018", Sense Labs, Inc., 5 pages.

19206642.1, "European Application Serial No. 19206642.1, Extended European Search Report dated Feb. 26, 2020", Sense Labs, Inc., 9 pages.

Alles, et al., "A Commercial Disaggregation System for Residential and Light Commercial Buildings", Presented on Jun. 3, 2014 at the NILM Workshop 2014, University of Texas at Austin, http://nilmworkshop14.files.wordpress.com/2014/05/alles_commercial.pdf, accessed on Dec. 22, 2014, 4 pages.

Anderson, et al., "Unsupervised Approximate Power Trace Decomposition Algorithm", Presented on Jun. 3, 2014 at the NILM Workshop 2014, University of Texas at Austin, http://nilmworkshop14.files.wordpress.com/2014/05/anderson_unsupervised.pdf, accessed on Dec. 22, 2014, 4 pages.

Anonymous, "Smart meter", Wikipedia, Retrieved from the Internet: URL:https://en.wikipedia.org/w/index.php?title=Smart_meter&oldid=634667241 [retrieved on Oct. 8, 2019], 2014, 18 pages.

Armel, et al., "Is Disaggregation the Holy Grail of Energy Efficiency? The Case of Electricity", Precourt Energy Efficiency Center Technical Paper Series: PTP-2012-05-1, Stanford University, http://web.stanford.edu/group/peec/cgi-bin/docs/behavior/research/disaggregation-armel.pdf accpt /publ. in: Energy Policy, 2013, vol. 52, issue C, pp. 213-234, May 1, 2012, 50 pages.

Barker, et al., "NILM Redux: The Case for Emphasizing Applications over Accuracy", Presented on Jun. 3, 2014 at the NILM Workshop 2014, University of Texas at Austin, http://nilmworkshop14.files.wordpress.com/2014/05/barker_nilm.pdf , accessed on Dec. 22, 2014, 4 pages.

Barsim, et al., "An Approach for Unsupervised Non-Intrusive Load Monitoring of Residential Appliances", Presented on Jun. 3, 2014 at the NILM Workshop 2014, University of Texas at Austin, http://nilmworkshop14.files.wordpress.com/2014/05/barsim_approach.pdf , accessed on Dec. 22, 2014, 5 pages.

Batra, et al., "NILMTK: An Open Source Toolkit for Non-intrusive Load Monitoring", Presented on Jun. 3, 2014 at the NILM Workshop 2014, University of Texas at Austin, http://nilmworkshop14.files.wordpress.com/2014/05/batra_nilmtk.pdf , accessed on Dec. 22, 2014, 4 pages.

Bilski, et al., "Analysis of the artificial intelligence methods applicability to the non-intrusive load monitoring", Presented on Jun. 3, 2014 at the NILM Workshop 2014, University of Texas at Austin, http://nilmworkshop14.files.wordpress.com/2014/05/bilski_analysis.pdf, accessed on Dec. 22, 2014, 4 pages.

Brown, et al., "Using Wireless Power Meters to Measure Energy Use of Miscellaneous and Electronic Devices in Buildings", Proceedings of the Energy Efficiency in Domestic Appliances and Lighting (EEDAL) 20001 Conference, Copenhagen, Denmark, May 24-26, 2011, 14 Pages.

Cheshire, et al., "Multicast DNS", Internet Engineering Task Force (IETF), Request for Comments: 6762, Category Standards Track, ISSN: 2070-1721, Apple, Inc., https://tools.ietf.org/html/rfc6762 (accessed Mar. 13, 2017), Feb. 2013, 140 pages.

Cheshire, "Zero Configuration Networking (Zeroconf)", http://www.zeroconf.org/ (accessed Mar. 13, 2017), 4 pages.

Dong, et al., "Energy Disaggregation via Adaptive Filtering", Presented on Jun. 3, 2014 at the NILM Workshop 2014, University of Texas at Austin, http://nilmworkshop14.files.wordpress.com/2014/05/dong_energy.pdf, accessed on Dec. 22, 2014, 4 pages.

Figueiredo, et al., "On the Optimization of Appliance Loads Inferred by Probabilistic Models", Presented on Jun. 3, 2014 at the NILM Workshop 2014, University of Texas at Austin, http://nilmworkshop14.files.wordpress.com/2014/05/figueiredo_optimization.pdf , accessed on Dec. 22, 2014, 4 pages.

Froehlich, et al., "Disaggregated End-Use Energy Sensing for the Smart Grid", Pervasive Computing, IEEE, vol. 10, Iss. 1, Jan.-Mar. 2011, pp. 28-39.

Goland, et al., "Simple Service Discovery Protocol/1.0, Operating without an Arbiter, <draft-cai-ssdp-v1-03.txt>", Internet Engineering Task Force, Internet Draft, Microsoft Corporation, Shivaun Albright, Hewlett-Packard Company, https://tools.ietf.org/html/draft-cai-ssdp-v1-03, (accessed on Mar. 13, 2017), Oct. 28, 1999, 36 pages.

Holmegaard, et al., "Towards Automatic Identification of Activity Modes in Electricity Consumption Data for Small and Medium Sized Enterprises", Presented on Jun. 3, 2014 at the NILM Workshop 2014, University of Texas at Austin, http://nilmworkshop14.files wordpress.com/2014/05/holmegaard_towards.pdf, accessed on Dec. 22, 2014, 4 pages.

Jacquemod, et al., "Innovating current sensor for NILM application", Presented on Jun. 3, 2014 at the NILM Workshop 2014, University of Texas at Austin, http://nilmworkshop14.files.wordpress.com/2014/05/acquemod_innovating.pdf, accessed Dec. 22, 2014, 4 pages.

Jazizadeh, et al., "An unsupervised hierarchical clustering based heuristic algorithm for facilitated training of electricity consumption disaggregation systems", Advanced Engineering Informatics 28.4, 2014, pp. 311-326.

(56) References Cited

OTHER PUBLICATIONS

Kelly, et al., "Metadata for Energy Disaggregation", Presented on Jun. 3, 2014 at the NILM Workshop 2014, University of Texas at Austin, http://nilmworkshop14.files.wordpress.com/2014/05/kelly_metadata.pdf, accessed on Dec. 22, 2014, 4 pages.

Li, et al., "Energy Disaggregation via Hierarchical Factorial HMM", Presented on Jun. 3, 2014 at the NILM Workshop 2014, University of Texas at Austin, http://nilmworkshop14.files.wordpress.com/2014/05/li_energy.pdf, accessed on Dec. 22, 2014, 4 pages.

Liao, et al., "Power Disaggregation for Low-sampling Rate Data", Presented on Jun. 3, 2014 at the NILM Workshop 2014, University of Texas at Austin, http://nilmworkshop14.files.wordpress.com/2014/05/liao_power.pdf, accessed on Dec. 22, 2014, 4 pages.

Maasoumy, et al., "Handling model uncertainty in model predictive control for energy efficient buildings", Energy and Building, vol. 77, Apr. 1, 2014 (online), pp. 377-392.

Makonin, et al., "Efficient Sparse Matrix Processing for Nonintrusive Load Monitoring (NILM)", Presented on Jun. 3, 2014 at the NILM Workshop 2014, University of Texas at Austin, http://nilmworkshop14.files.wordpress.com/2014/05/makonin_efficient.pdf , accessed on Dec. 22, 2014, 4 pages.

Makonin, et al., "The cognitive power meter: Looking beyond the smart meter", 2013 26th IEEE Canadian Conference on Electrical and Computer Engineering (CCECE). IEEE, 2013, pp. 1-5.

PCT/US18/18897, "International Application Serial No. PCT/US18/18897, International Preliminary Report on Patentability dated Sep. 6, 2019", Sense Labs, Inc., 5 pages.

PCT/US18/18897, "International Application Serial No. PCT/US18/18897, International Search Report and Written Opinion dated Mar. 16, 2018", Sense Labs, Inc., 8 Pages.

PCT/US19/54062, "International Application Serial No. PCT/US19/54062, International Search Report and Written Opinion dated Jan. 2, 2020", Sense Labs, Inc., 15 pages.

PCT/US2014/067662, "International Application Serial No. PCT/US2014/067662, International Preliminary Report on Patentability and Written Opinion dated Jun. 8, 2017", Sense Labs, Inc., 10 Pages.

PCT/US2014/067662, "International Application Serial No. PCT/US2014/067662, International Search Report and Written Opinion dated Aug. 12, 2015", Sense Labs, Inc., 13 pages.

PCT/US2015/062346, "International Application Serial No. PCT/US2015/062346 International Search Report and Written Opinion dated Feb. 29, 2016", Sense Labs, Inc., 14 pages.

PCT/US2015/062346, "International Application Serial No. PCT/US2015/062346, International Preliminary Report on Patentability and Written Opinion dated Jun. 8, 2017", Sense Labs, Inc., 11 Pages.

Perez, et al., "Nonintrusive Disaggregation of Residential Air-Conditioning Loads from Sub-houriy Smart Meter Data", Presented on Jun. 3, 2014 at the NILM Workshop 2014, University of Texas at Austin, http://nilmworkshop14.files.wordpress.com/2014/05/perez_nonintrusive1.pdf, accessed on Dec. 22, 2014, 4 pages.

Phillips, et al., "Supero: A sensor system for unsupervised residential power usage monitoring", 2013 IEEE International Conference on Pervasive Computing and Communications (PerCom). IEEE, 2013, pp. 66-75.

Tang, et al., "Semi-Intrusive Load Monitoring for Large-Scale Appliances", Presented on Jun. 3, 2014 at the NILM Workshop 2014, University of Texas at Austin, http://nilmworkshop14.files.wordpress.com/2014/05/tang_semiintrusive.pdf , accessed on Dec. 22, 2014, 4 pages.

Trung, et al., "Event Detection and Disaggregation Algorithms for NIALM System", Presented on Jun. 3, 2014 at the NILM Workshop 2014, University of Texas at Austin, http://nilmworkshop14.files.wordpress.com/2014/05/trung_event.pdf , accessed on Dec. 22, 2014, 4 pages.

Tyler, et al., "Direct, Instantanious Identification of Home Appliances", Presented on Jun. 3, 2014 at the NILM Workshop 2014, University of Texas at Austin, http://nilmworkshop14.files.wordpress.com/2014/05/tyler_direct.pdf, accessed on Dec. 22, 2014, 4 pages.

Zalewski, "p0f v3 (version 3.09b)", http://lcamtuf.coredump.cx/p0f3/ (accessed on Mar. 13, 2017), copyright 2012-2014, 4 pages.

Zeifman, "Disaggregation of home energy display data using probabilistic approach", IEEE Transactions on Consumer Electronics 58.1, 2012, pp. 23-31.

U.S. Appl. No. 29/697,884, filed Jul. 11, 2019, Pending, Jeffrey Jay Weinstein.

U.S. Appl. No. 16/858,905, filed Apr. 27, 2020, Pending, John Andrew Watlington.

18756635.1 , "European Application Serial No. 18756635.1, Extended European Search Report dated Nov. 17, 2020", Sense Labs, Inc., 8 pages.

2202632.2 , "United Kingdom Application Serial No. 2202632.2, Search Report dated Mar. 30, 2022", Sense Labs, Inc., 1 page.

Aliexpress , "Current Sensor Clamp Current Sensor", Link: https://www.aliexpress.com/item/4000269161232.html?ws_ab_test=searchweb0_0,searchweb201602_0,searchweb201603_0,ppcSwitch_0&algo_pvid=5c669c1e-d376-4a8e-893a-db216e298d26&algo_expid=5c669c1e-d376-4a8e-893a-db216e298d26-22. Visited Sep. 13, 2020., 2020, 12 pages.

Anonymous , "Nonintrusive load monitoring—Wikipedia", Nov. 7, 2014, 3 pages.

Dewesoft , "High-accuracy Current Sensors and Transducers", Link: https://dewesoft.com/products/interfaces-and-sensors/current-clamps-and-transducers. Visited Sep. 13, 2020., 2020, 17 pages.

PCT/US19/54062 , "International Application Serial No. PCT/US19/54062, International Preliminary Report on Patentability dated Apr. 15, 2021", Sense Labs, Inc., 14 pages.

* cited by examiner

FIG. 3B
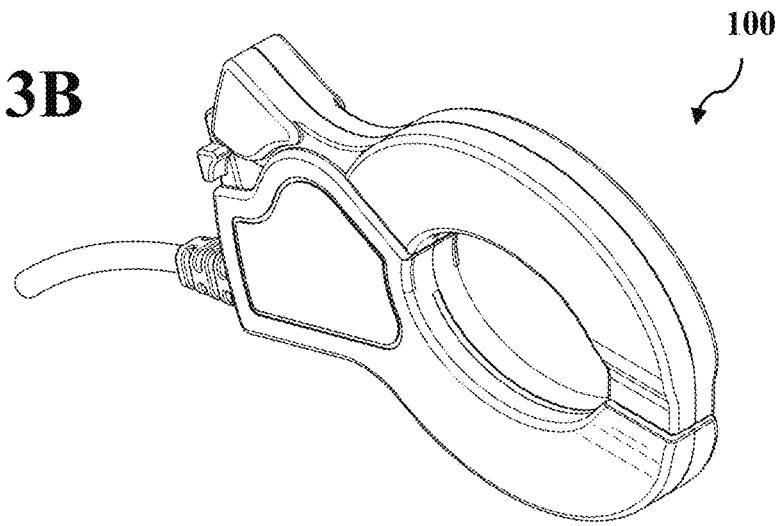
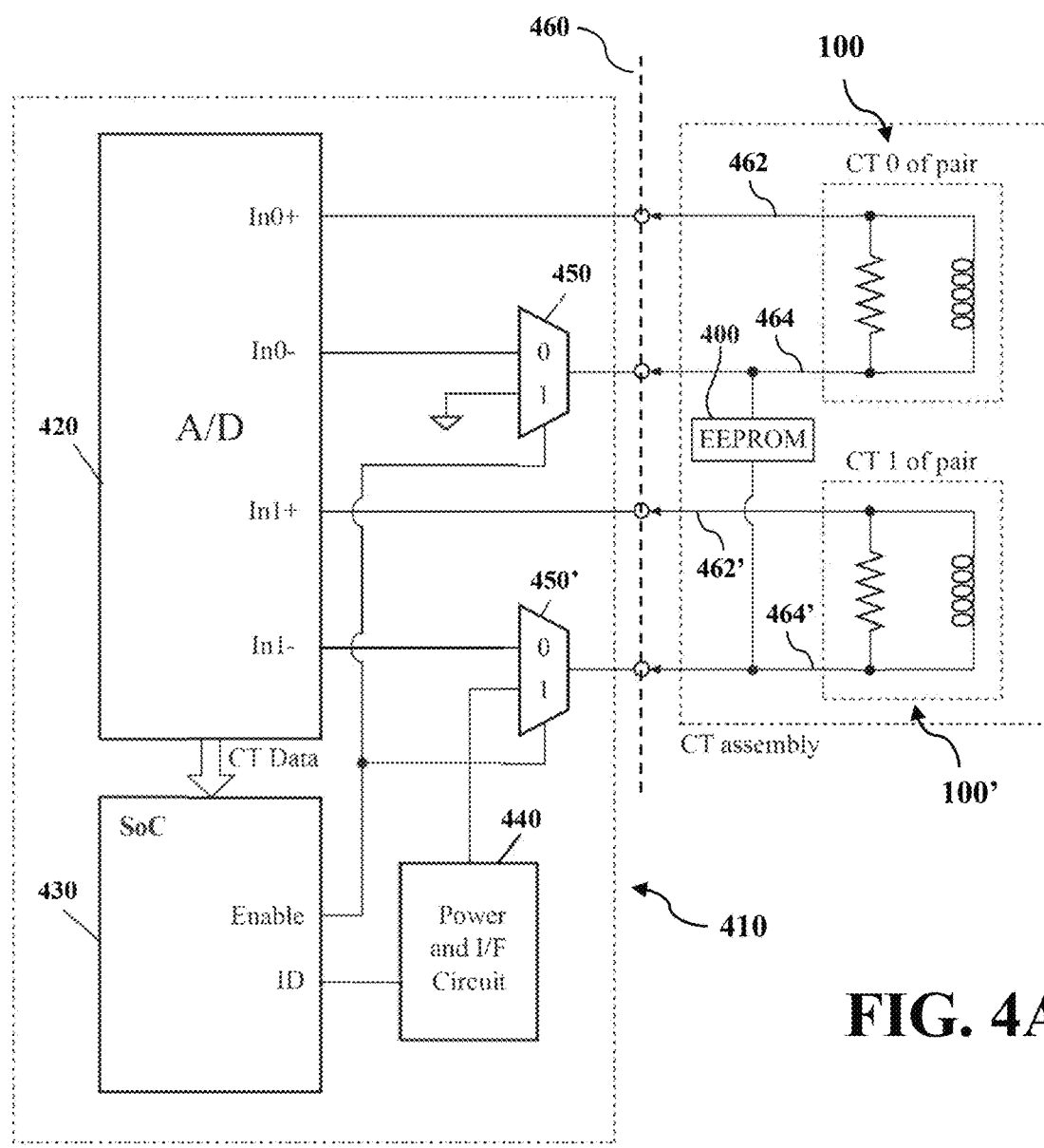
FIG. 4A

CURRENT TRANSFORMER WITH SELF-ADJUSTING CORES

CROSS-REFERENCE TO RELATED APPLICATION

This application claims priority to U.S. Provisional Patent Application Ser. No. 62/873,132, filed Jul. 11, 2019, and entitled "Current Transformer Apparatus" (SAGE-0007-P01). The foregoing application is incorporated herein by reference in its entirety for all purposes.

FIELD OF INVENTION

The apparatus described herein generally relate to a current transformer for attaching to and measuring electrical current through one or more electrical mains.

BACKGROUND

Reducing electricity or power usage provides the benefits, among others, of saving money by lowering payments to electric companies and also protecting the environment by reducing the amount of resources needed to generate the electricity. Electricity users, such as consumers, businesses, and other entities, may thus desire to reduce their electrical usage to achieve these benefits. Users may be able to more effectively reduce their electricity usage if they have information about electricity usage.

Power monitors for individual devices are available for measuring the power usage of a single device. For example, a device can be plugged into a power monitor, and the monitor can in turn be plugged into a wall outlet. These power monitors can provide information about power usage for the one device they are attached to, but it may not be practical to monitor all or even many devices in a house or building with these power monitors, because it would require a large number of devices that can be expensive and also require significant manual effort to install.

Instead of a power monitor for a single device, a power monitor can be installed at an electrical panel to obtain information about electricity used by many devices simultaneously over one or more electrical mains each providing, for example, 120 volts. The ability to monitor the electricity passing through one or more electrical mains may be enhanced by a physical link to each main capable of sensing the electricity passing through the main. However, various codes restrict the amount of space available to situate a device or devices to perform such sensing.

What is therefore needed is a device adapted to attach to or in close proximity to an electrical main that is capable of sensing electrical current through the mains that is compact and easily manipulated.

SUMMARY

In accordance with an exemplary and non-limiting embodiment, a current transformer may include a first housing having a first handle portion and a first distal portion; a second housing having a second handle portion and a second distal portion; a first core having a first proximal core end and a first distal core end, the first core mounted in rotational contact within the first distal portion; and a second core having a second proximal core end and a second distal core end, the second core mounted in rotational contact within the second distal portion; wherein the first housing is rotationally coupled to the second housing about a fulcrum point and wherein, when the first housing and the second housing are rotated into a closed position, the first core is adapted to rotate within the first distal portion and the second core is adapted to rotate within the second distal portion to enable contact between the first proximal core end and the second proximal core end and to enable contact between the first distal core end and the second distal core end. In embodiments, the pivot member may be attached to the first core and the first housing includes an indentation to receive the pivot member. A pivot member may be attached to the first housing and the first core has an indentation to receive the pivot member. There may be a gap between the first housing and the first core. The first housing may have a semi-elliptical shape. A ratio of (i) a distance between the fulcrum point and an end of the first distal portion and (ii) a distance between the fulcrum point and an end of the first handle portion may be at least 5 to 1, 7 to 1, and the like. A maximum thickness of the first housing may be less than or equal to 11 millimeters. The current transformer may include a lock attached to the second handle portion and adapted to rotate about an axis, wherein the lock is adapted to rotate about the axis into contact with the first handle portion preventing rotation of the first housing and the second housing about the fulcrum point. The lock may be made of plastic. The current transformer may include a memory chip adapted to store a first scale factor of the first core and a second scale factor of the second core.

In accordance with an exemplary and non-limiting embodiment, a current sensing device may include a current transformer for sensing a current in an alternating current (AC) power line, the current transformer including a first housing including a first handle portion and a first distal portion; a second housing including a second handle portion and a second distal portion; a first core having a first proximal core end and a first distal core end, the first core mounted in rotational contact within the first distal portion, wherein the first core is wrapped with a first conductor winding; and a second core having a second proximal core end and a second distal core end, the second core mounted in rotational contact within the second distal portion, wherein the second core is wrapped with a second conductor winding; wherein the first housing is rotationally coupled to the second housing about a fulcrum point and wherein, when the first housing and the second housing are rotated into a closed position, the first core is adapted to rotate within the first distal portion and the second core is adapted to rotate within the second distal portion to enable contact between the first proximal core end and the second proximal core end and to enable contact between the first distal core end and the second distal core end. In embodiments, a pivot member may be attached to the first core and the first housing includes an indentation to receive the pivot member. A pivot member may be attached to the first housing and the first core includes an indentation to receive the pivot member. There may be a gap between the first housing and the first core. The first housing may have a semi-elliptical shape. A ratio of (i) a distance between the fulcrum point and an end of the first distal portion and (ii) a distance between the fulcrum point and an end of the first handle portion may be 5 to 1, 7 to 1, and the like. A maximum thickness of the first housing may be less than or equal to 11 millimeters. The current sensing device may include a lock attached to the second handle portion and adapted to rotate about an axis, wherein the lock is adapted to rotate about the axis into contact with the first handle portion preventing rotation of the first housing and the second housing about the fulcrum point. The current sensing device may include a memory chip adapted to store a first scale factor of the first core and a second scale factor of the second core.

In accordance with an exemplary and non-limiting embodiment, a current transformer assembly may include a first current transformer; a plug; a first wire and a second wire between the plug and the first current transformer adapted to transmit a measurement of the first current transformer; and a memory chip adapted to store a first scale factor of the first current transformer. In embodiments, the memory chip may be situated inside the plug. The current transformer assembly may include a third wire between the plug and the memory chip, wherein the memory chip is connected to the second wire. The current transformer assembly may include a third wire between the plug and the memory chip, and a fourth wire between the plug and the memory chip. The current transformer assembly may include a second current transformer, and a third wire and a fourth wire between the plug and the second current transformer adapted to transmit a measurement of the second current transformer, and wherein the memory chip is adapted to store a second scale factor of the second current transformer. The memory chip may be connected to the second wire and the fourth wire. The memory chip may be adapted to store a first scale factor of the first current transformer and a second scale factor of the second current transformer.

In accordance with an exemplary and non-limiting embodiment, a system may include a current transformer assembly including a plug, a first current transformer, and a memory chip; a power monitor including at least one processor and at least one memory, wherein the power monitor is configured to: read a first scale factor for the first current transformer from the memory chip, receive a first sensor value from the first current transformer, compute a second sensor value from the first sensor value using the first scale factor, and use the second sensor value to determine information about energy consumption in a building. In embodiments, the memory chip may be situated inside the plug. The power monitor may read the first scale factor during a startup or initialization process. The current transformer assembly may further include a first wire and a second wire between the plug and the first current transformer, wherein the memory chip is connected to at least one of the first wire and the second wire. The current transformer assembly may further include a second current transformer, wherein the power monitor is further configured to: read a second scale factor for the second current transformer from the memory chip, receive a third sensor value from the second current transformer, compute a fourth sensor value from the third sensor value using the second scale factor, and use the second sensor value and the fourth sensor value to determine information about energy consumption in the building. The current transformer assembly may further include a first wire and a second wire between the plug and the first current transformer, a third wire and a fourth wire between the plug and the second current transformer, wherein the memory chip is connected to at least one of the first wire, second wire, third wire, and fourth wire. The memory chip may be connected to the second wire and the fourth wire.

In accordance with an exemplary and non-limiting embodiment, a method for calibrating a current transformer may include reading a first scale factor for a first current transformer from a memory chip, receiving a first sensor value from the first current transformer, computing a second sensor value from the first sensor value using the first scale factor, and using the second sensor value to determine current information. In embodiments, reading the first scale factor may be performed during a startup or initialization process. The information about energy consumption in the building may include information about at least a first electrical power consuming device and a second electrical power consuming device in the building. The method may further include reading a second scale factor for a second current transformer from the memory chip, receiving a third sensor value from the second current transformer, computing a fourth sensor value from the third sensor value using the second scale factor, and using the second sensor value and the fourth sensor value to determine information about energy consumption in the building. The first scale factor may be a first calibration factor for the first current transformer and the second scale factor may be a second calibration factor for the second current transformer. The method may further include reading a current transformer identifier from the memory chip.

In accordance with an exemplary and non-limiting embodiment, a current transformer may include a first semi-elliptical housing including a first handle portion and a first distal portion, a second semi-elliptical housing including a second handle portion and a second distal portion, a first core having a first proximal core end and a first distal core end the first core mounted in rotational contact within the first distal portion and a second core having a second proximal core end and a second distal core end the second core mounted in rotational contact within the second distal portion wherein the first semi-elliptical housing is rotationally coupled to the second semi-elliptical housing about a fulcrum point. In embodiments, a ratio of (i) a distance between the fulcrum point and an end of the first distal portion and (ii) a distance between the fulcrum point and an end of the first handle portion may be at least 5 to 1, 7 to 1, and the like. A maximum thickness of the first semi-elliptical housing is less than or equal to 9 millimeters, 11 millimeters, 13 millimeters, and the like.

In accordance with an exemplary and non-limiting embodiment, a current transformer may include a first housing having a first handle portion and a first distal portion, a second housing having a second handle portion and a second distal portion, a first core having a first proximal core end and a first distal core end the first core mounted within the first distal portion, a second core having a second proximal core end and a second distal core end the second core mounted within the second distal portion; and a lock attached to the second handle portion and adapted to rotate about an axis, wherein the first housing is rotationally coupled to the second housing about a fulcrum point and wherein the lock is adapted to rotate about the axis into contact with the first handle portion preventing rotation of the first housing and the second housing about the fulcrum point. In embodiments, the first core may be mounted in rotational contact within the first distal portion and the second core is mounted in rotational contact within the second distal portion. The lock may be made of plastic. The first housing and or the second housing may have a semi-elliptical shape.

In accordance with an exemplary and non-limiting embodiment, a current transformer may include a first housing having a first handle portion, a first distal portion and a cylindrical first hinge portion, a second housing having a second handle portion, a second distal portion and a cylindrical second hinge portion, a first core having a first proximal core end and a first distal core end the first core mounted within the first distal portion, a second core having a second proximal core end and a second distal core end the second core mounted within the second distal portion; and a spring; and a hinge including the cylindrical first hinge portion, the cylindrical second hinge portion, and the spring, wherein the cylindrical first hinge portion in rotational contact with the cylindrical second hinge portion about which is positioned the spring, the spring adapted to produce a rotational force between the first housing and the second housing. In embodiments, a center of a coil of the spring may be located at a fulcrum of the hinge. A coil of the spring may be located within the cylindrical first hinge portion and the cylindrical second hinge portion.

BRIEF DESCRIPTION OF THE FIGURES

FIG. 3B illustrates an exemplary and non-limiting embodiment of an isometric view of a current transformer.

FIG. 4A illustrates an exemplary and non-limiting embodiment of a circuit diagram.

DETAILED DESCRIPTION

A power monitor may be installed in a building to obtain information about power usage within the building. For example, a power monitor may be installed in a conventional electrical panel, may be part of a smart electrical panel, or may be part of a smart electrical meter. A power monitor may determine information about power consumption by using sensors that measure an electrical property of the power mains (e.g., alternating current (AC) power line) that provide power to the building or an electrical property of power generated by solar panels. For example, where a building has two power mains, a power monitor may have a sensor (e.g., a current sensing device) for each of the two mains. In some embodiments, the sensors of a power monitor may include a current transformer, such as any of the current transformers described herein. A power monitor may have any of the characteristics of power monitors as described in U.S. Pat. Nos. 9,443,195; 9,699,529; or U.S. Pat. No. 10,586,177, each of which are incorporated herein by reference in their entireties.

Figure 1:
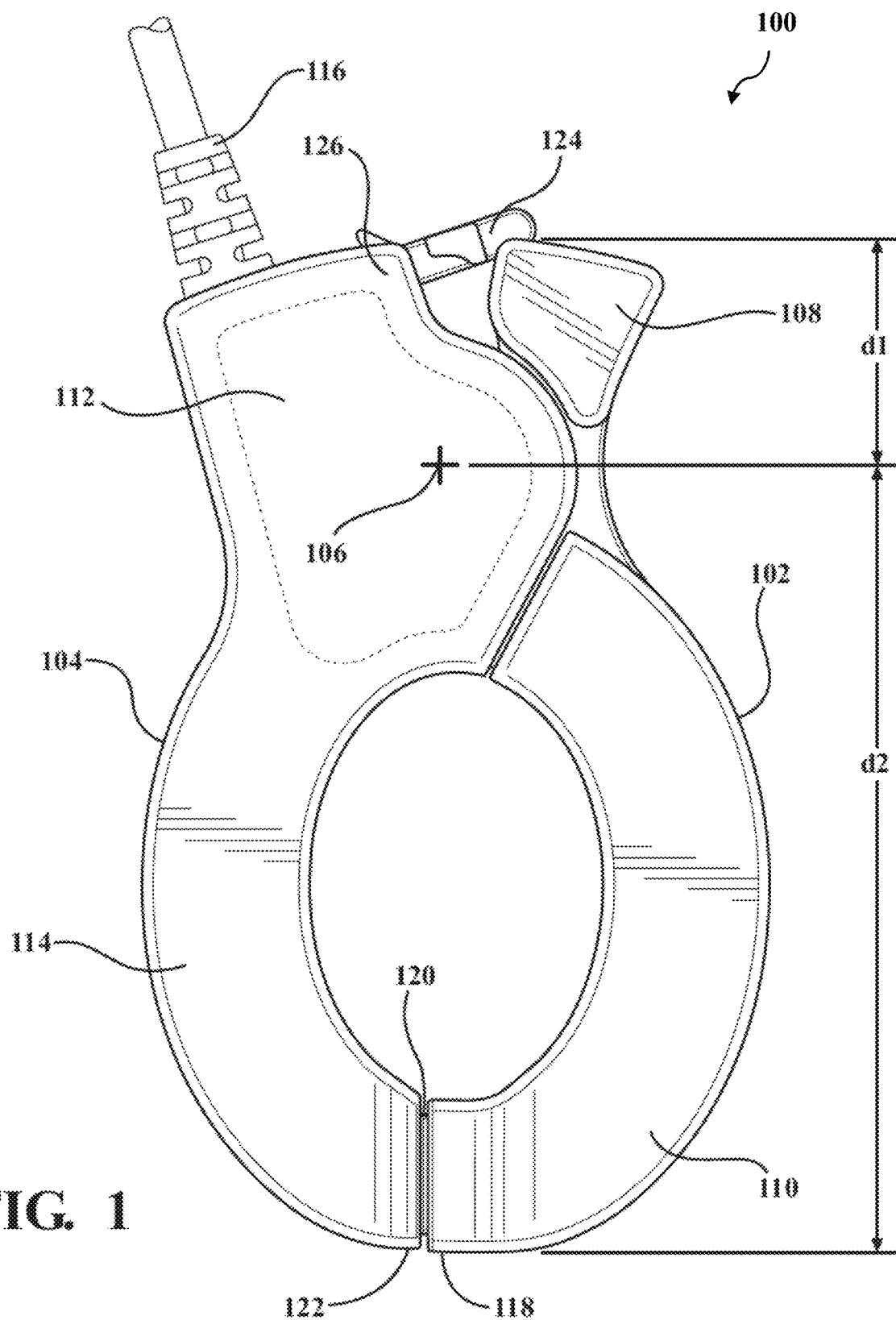
FIG. 1 illustrates an exemplary and non-limiting embodiment of a current transformer in a closed position.

With reference to FIG. 1, there is illustrated an exemplary and non-limiting embodiment of a current transformer 100. Current transformer 100 includes in part a clamp formed of a semi-elliptical first housing 102 and a semi-elliptical second housing 104. First housing 102 is formed of first handle portion 108 and first distal portion 110. Likewise, second housing 104 is formed of second handle portion 112 and second distal portion 114. First distal portion 110 extends and terminates at first housing terminus 118 while second distal portion 114 extends and terminates at second housing terminus 122, such as including a mating portion 120 to reduce misalignment.

First housing 102 and second housing 104 rotate axially about fulcrum point 106. Fulcrum point 106 defines, generally, the division between the second handle portion 112 and second distal portion 114 of second housing 104. Fulcrum point 106 similarly defines, generally, the division between the first handle portion 108 and first distal portion 110 of first housing 102. As described more fully below, an internal spring situated around the fulcrum point 106 provides rotational force to each of the first housing 102 and second housing 104 so as to render the current transformer 100 in a closed state with a first housing terminus 118 in contact with a second housing terminus 122.

As configured, an operator of current transformer 100 may squeeze, with one hand, first handle portion 108 and second handle portion 112 towards one another resulting in a rotation of the first housing 102 and second housing 104 about fulcrum point 106 and separating first housing terminus 118 from second housing terminus 122.

First housing terminus 118 and second housing terminus 122 may be thus separated a distance sufficient greater than or equal to a diameter of an electrical main. As a result, when first handle portion 108 and second handle portion 112 are squeezed so as to separate the first housing terminus 118 from second housing terminus 122, an electrical main may be slid into the gap so formed at which point the pressure applied to first handle portion 108 and second handle portion 112 may be released. Releasing the pressure applied to first handle portion 108 and second handle portion 112 causes the current transformer 100 to return to a closed state whereby the electrical main is secured between first distal portion 110 and second distal portion 114.

Fulcrum point 106 divides the longitudinal extent of current transformer 100 into a proximal distance d1 and a distal distance d2. The ratio of d1 to d2 may be between 1:5 and 1:8, preferably approximately 1:7. A ratio of 1:7 allows for a distance d1 that is sufficiently small to allow for a user to open the current transformer 100 with one hand. These ratios produce a reduced end-to-end length of the current transformer 100 that allows the maximum oval area for engagement with a reduced handle size so as to fit into tight places. The ratio allows a smaller handle while enabling single hand installation due to low spring force and design features of the hinge. In some embodiments, first and second housings 102, 104 are formed of plastic material and have an overall thickness of approximately 11 millimeters (mm), which may be thinner than conventional current transformers. The thickness of the walls of the plastic housing may nevertheless be sufficient to meet the UL94 V-0 flame retardant rating.

Connector 116 may provide electrical signals to and from current transformer 100. In one embodiment, connector 116 transmits a signal generated by the current transformer 100 resulting from electrical current passing through an electrical main.

Figure 2:
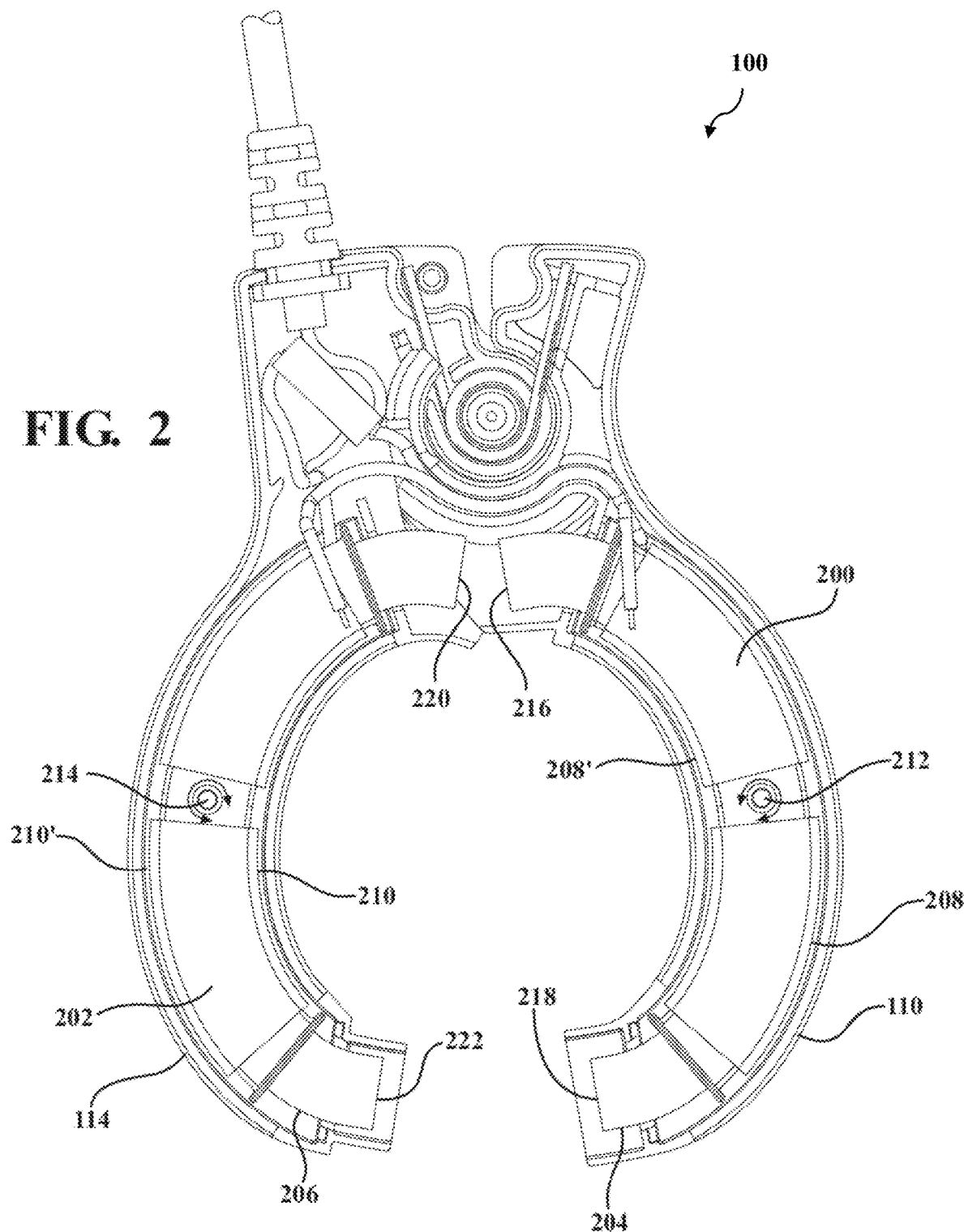
FIG. 2 illustrates an exemplary and non-limiting embodiment of a current transformer in an open position with covers removed.

With reference to FIG. 2, there is illustrated an exemplary and non-limiting embodiment of current transformer 100 in a cutaway view showing the internal geometry and construction of current transformer 100. Housed within first distal portion 110 is core 204. Cores 204, 206 may be fabricated of a ferrite homogeneous material (providing low performance, lowest cost) and/or a homogeneous iron cores (providing mid performance, mid cost), or iron cores made from laminated sheets (providing highest performance, highest cost). In addition, there are several grades of silicon iron cores that may be employed. In some embodiments, there may be employed a silicon iron core that is laminated in sheets to create the structure having, for example, a reduced cross sectional area being approximately 3.5 mm×7.5 mm adapted to produce a small geometry with the maximum flux saturation for best performance.

Similarly, housed within second distal portion 114 is core 206. Core 204 is surrounded along a sizeable portion of its length by winding 200. Core 206 is surrounded along a sizeable portion of its length by winding 202. Note that both of core 204 and winding 200 fit inside the walls of first distal portion 110 such that gaps 208, 208' exist on either side of core 204 and winding 200 between the walls forming first distal portion 110. Similarly, core 206 and winding 202 fit inside the walls of second distal portion 114 such that gaps 210, 210' exist on either side of core 206 and winding 202 between the walls forming second distal portion 114.

Figure 3A:
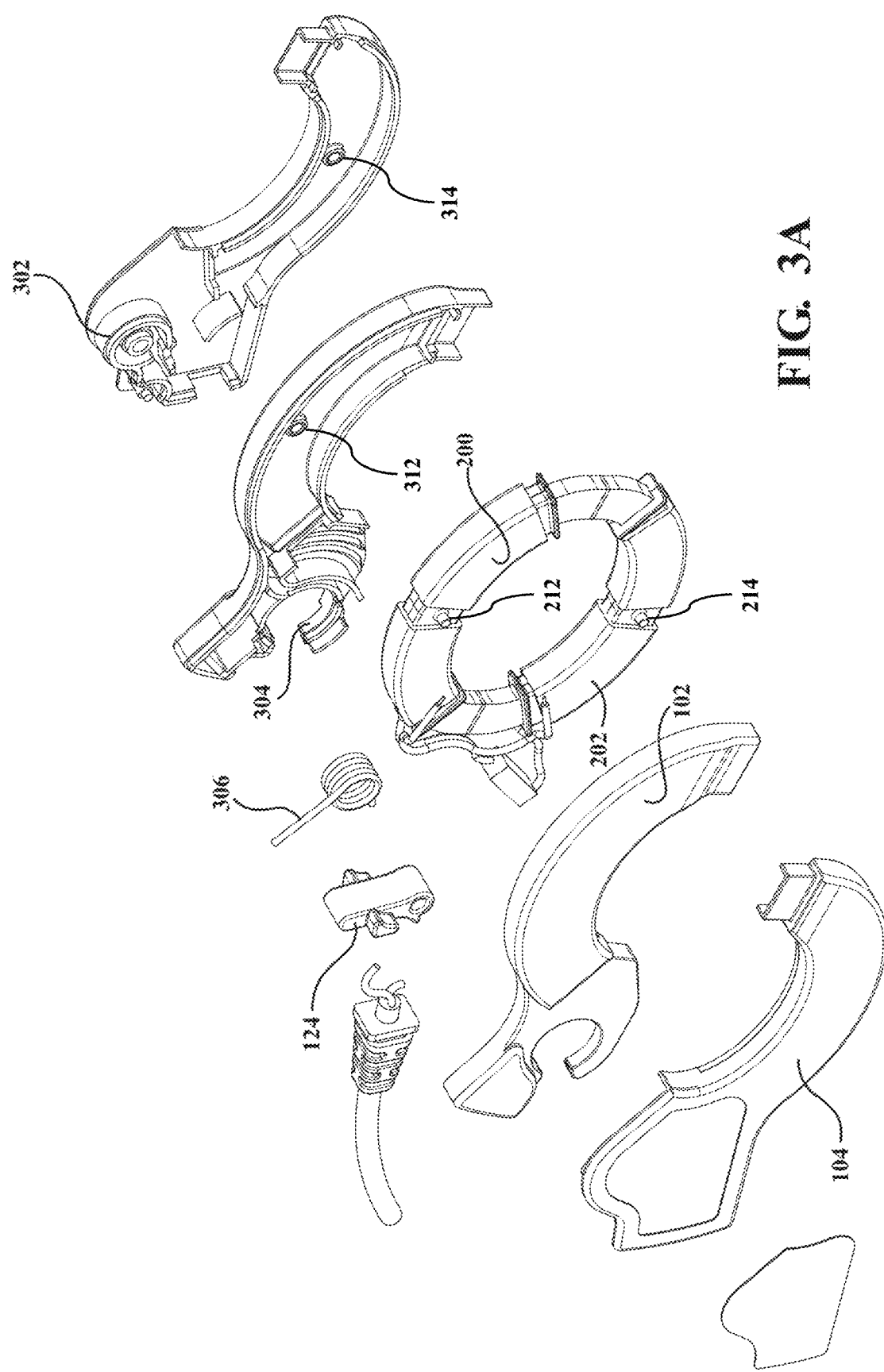
FIG. 3A illustrates an exemplary and non-limiting embodiment of an exploded view of a current transformer.

Extending through core 204 and winding 200 is pivot member 212. Pivot member 212 is generally cylindrical in shape and is adapted such that opposing ends of pivot member 212 may by inserted into reciprocating holes or indentations 312 (as illustrated in FIG. 3A) fabricated into the walls of first distal portion 110 so as to allow core 204 and winding 200 to rotate about pivot member 212 as indicated within first distal portion 110 and as provided by gaps 208, 208'. In an alternate embodiment, pivot member 212 may be attached to the surface of core 204. Conversely, in an alternate embodiment, one or more pivot members may be fabricated as part of the first and second distal portions with such pivot members engaging with one or more holes or indentations fabricated as part of cores 204, 206 or in a casing enclosing cores 204, 206.

Extending through core 206 and winding 202 is pivot member 214. Pivot member 214 is generally cylindrical in shape and is adapted such that opposing ends of pivot member 214 may by inserted into reciprocating holes 314 (as illustrated in FIG. 3A) fabricated into the walls of second distal portion 114 so as to allow core 206 and winding 202 to rotate about pivot member 214 as indicated within second distal portion 114 and as provided by gaps 210, 210'.

When in a closed position, first proximal core end 216 comes into contact with second proximal core end 220. Similarly, first distal core end 218 comes into contact with second distal core end 222. By allowing each of cores 204, 206 to rotate about corresponding pivot members 212, 214, each core 204, 206 is adapted to rotate into a position whereby first distal core end 218 rests in contact with second distal core end 222 and first proximal core end 216 rests in contact with second proximal core end 220. Without the ability of cores 204, 206 to rotate about corresponding pivot members 212, 214, the contacts between the distal core ends and/or the proximal core ends may be incomplete or insufficient, and thus reducing the accuracy of the current transformer.

An advantage of the configuration of current transformer 100 is that the amount of force applied by spring 306 to close the clamp may be reduced. The reduced force of spring 306 allows for easier opening of the clamp by an operator using only one hand. The configuration of the current transformer allows a reduced force spring to provide sufficient mating and contact between the ends of core 204 and core 206.

With continued reference to FIG. 1, lock 124 extends from second handle portion 112 and is axially connected thereto so as to rotate about pivot point 126. As noted above, FIG. 1 shows the current transformer 100 in a closed position. When in such a position, lock 124 may be rotated axially about pivot point 126 to engage with first handle portion 108 so as to prevent either first handle portion 108 or second handle portion 112 from moving towards one another when squeezed by a user. Engaging lock 124 ensures that the two halves of the cores 204, 206, achieve and maintain solid contact with each other. Lock 124 further ensures that when a panel of a cabinet in which the current transformer 100 is housed is closed, neither the panel nor other components will force the current transformer 100 to open. As illustrated, the lock 124 closing action is in the desired direction to mechanically wedge the assembly closed.

The lock 124 may provide a tactile and audible feedback that it is engaged. The lock 124 is designed to "CAM" away when the current transformer 100 is being opened, to avoid any cumbersome motion to pull it away while opening the current transformer for installation, in any direction. The lock is further designed to be locked with one hand and unlocked with one hand, keeping the hand from any area with a live conductor. As a result, current transformer 100 complies, generally, with industry standard IEC61010-2-032 directed to hand held and hand manipulated parts whereat a hand held part is defined as a part intended to be supported by one hand during normal use. More specifically, IEC61010-2-032 defines a type A current sensor as: " . . . a current sensor designed to be applied around or removed from UNINSULATED HAZARDOUS LIVE conductors. Type A current sensors have defined HAND-HELD or hand-manipulated parts providing protection against electric shock from the conductor being measured, and also have protection against short-circuits between wires and busbars during clamping". The lock may be constructed of any appropriate material, such as plastic.

With reference to FIG. 3A, there is illustrated an exemplary and non-limiting embodiment of an exploded view of current transformer 100. Current transformer is designed to be relatively thin, preferably less than 11 mm front to back, to facilitate operation in confined environments. This requirement for thinness of the current transformer 100 limits the amount of plastic available for a secure hinge. In the illustrated embodiment, first hinge portion 302 is adapted to be inserted in rotational contact with second hinge portion 304 forming a hinge providing rotation of first housing 102 and second housing 104 about fulcrum point 106. The concentric circle style hinge is formed by concentrically located first hinge portion 302 and second hinge portion 304. The concentric style hinge provides sufficient support for rotating the first housing 102 with respect to second housing 104 despite the relatively thin nature of the housings. The concentric style hinge may also reduce any misalignment of first housing 102 with respect to second housing 104 across all three axes and thus improve mating and contact between the ends of core 204 and core 206.

Each of first hinge portion 302 and second hinge portion 304 may be in the shape of a portion of a cylinder. An outer surface of first hinge portion 302 may be in contact with an inner surface of second hinge portion 304. When the current transformer is opened or closed, the surfaces of first hinge portion 302 and second hinge portion 304 may rotate against one another. The cylindrical and concentric construction of the hinge provides a larger surface area than conventional hinges and thus provides more physical support for the hinge. First hinge portion 302 and second hinge portion 304 may be constructed of any appropriate material, such as plastic.

The top covers of first housing 102 and second housing 104 may have complementary features to mate with first hinge portion 302 and second hinge portion 304. These complementary features may engage with the first hinge portion 302 and second hinge portion 304 to reduce any misalignment of first housing 102 with respect to second housing 104 across all three axes and thus improve mating and contact between the ends of core 204 and core 206.

The spring 306 may be concentric to the hinge and may be, for example, a torsion spring. In some embodiments, a center point of the coil of the spring 306 may be located at the fulcrum of the hinge. In some embodiments, the coil of the spring 306 may be inside both first hinge portion 302 and second hinge portion 304 and one or more legs of the spring may extend through first hinge portion 302 and/or second hinge portion 304 to provide resistance when the clamp is opened. Where the coil of spring 306 is inside hinge portion 302 and second hinge portion 304, greater separation may be achieved between the live wires of the transformer and the metal of the spring (isolating live parts from dead metal), and the separation may provide for increased safety of the current transformer. This configuration may provide increased dielectric isolation of the spring from live parts and assist with compliance with UL 2808. The top cover of first housing 102 interlocks with second hinge portion 304 to provide a wire path for the wires connected to winding 202, and the top cover of second housing 104 interlocks with first hinge portion 302 to provide a wire path for the wires connected to winding 200. The interlocks also prevent the wires from coming in contact with dead metal, such as spring 306. FIG. 3B illustrates an exemplary and non-limiting embodiment of an isometric view of a current transformer.

With further reference to FIG. 3A, reciprocating holes or indentations 312 are illustrated to allow core 204 and winding 200 to rotate about pivot member 212 (second pivot member hidden from view), and reciprocating holes or indentations 314 are illustrated to allow core 206 and winding 202 to rotate about pivot member 214 (second pivot member hidden from view).

With reference to FIG. 4A, there is illustrated an exemplary and non-limiting embodiment of a circuit diagram of a current transformer assembly including two current transformers 100, 100' that is connected to a current transformer interface 410 through a connection interface 460 (e.g., a multi-wire cable with plug for connecting to the current transformer interface). The current transformer interface 410 may be used to interface with the current transformer assembly to obtain sensor readings (e.g., by a power monitoring device) or to configure the current transformer assembly, as described in greater detail below. In embodiments, the current transformer interface 410 may be integrated into or represent the power monitor as described, where the terms "current transformer interface" and "power monitor" may be used interchangeably herein.

As illustrated, a memory chip 400, is attached to existing negative wires 464 464' of each current transformer 100, 100', and thus, in some embodiments, may not require any additional wires (e.g., as provided through the connector interface 460) to accommodate connection to the memory chip 400. Memory chip 400 may use any appropriate techniques for storing data, such as a volatile memory chip, a non-volatile memory chip, an EEPROM (electrically erasable programmable read-only memory), or EPROM (erasable programmable read-only memory). In some embodiments, positive wires 462 462' may be utilized instead of negative wires 464 464' or both negative and positive wires may be utilized (e.g., negative wire 464' and positive wire 462'. In a non-limiting example, the memory chip 400 may be connected to the two wires of a current transformer 100, one wire of the current transformer 100 and one wire of the current transformer 100', or two wires of a current transformer 100'.

In use, different current transformers may differ one from another in their sensitivity. As a result, two different current transformers 100 making a reading of the same electrical main may differ slightly. Prior to use, during a calibration process, a scale factor is computed for each of the two current transformers 100, 100' and stored on the memory chip 400. When the current transformers are used with a power monitor, the power monitor may obtain the scale factors for the current transformers from memory chip 400, and use the scale factors to obtain more accurate readings from the current transformers. For example, a true current being measured may be 8 amps. A first current transformer may indicate a current value of 10 amps. The scale factor stored on memory chip 400 for the first current transformer may allow the power monitor to correct the signal received from the first current transformer to determine that the current is actually 8 amps. For example, the scale factor may indicate to adjust the signal or a value received from the first current transformer downwards by a factor of 0.2 or 20%. The power monitor may then compute an adjusted value using the scale factor and use the adjusted value for determining information about energy consumption for one or more electrical power consuming devices in a building (such as any of the information described in the incorporated patents and applications).

As a result, if a new pair of current transformers 100, 100' is swapped with an existing pair of an assembly, the scale factors of each new current transformer 100, 100' may be read and utilized such that input gathered from the newly swapped current transformers 100, 100' do not differ in scale from the previously used current transformers.

In some embodiments, the power monitor may read the scale factors from memory chip 400 during a startup or initialization process. In some embodiments, the power monitor may read the scale factors when instructed to do so (e.g., from a server computer in communication with the power monitor) or on a periodic basis. In some embodiments, the memory chip may be connected to the existing wires (e.g., negative wires) of the current transformer assembly. Similar chips used in Mac power cords use additional wires or contact points while the present embodiment reuses existing wires and connector pins, thus reducing the connector size without interfering with the operation of the current transformer.

In addition to the stored scaling factor, the memory chip 400 may store identifying information related to each current transformer in the form of a current transformer identifier (CTID). This identifier may indicate, for example, a date code, date of manufacture, or a location of manufacture. The ability to store and retrieve information indicative of a unique current transformer 100 decreases repair costs, increases accuracy, and makes installation easier. In addition, installation is easier as there is no need to match a current transformer to a unit jack. Further, product support is reduced as mis-installed current transformers may result in support calls about inaccuracy. Repair costs are further reduced as there is no need to replace a power monitor and current transformers as a unit—just the failing component.

With reference to FIG. 4A, current transformer interface 410 may be used to obtain sensor readings from the current transformer, read the scale factors from memory chip 400, or write the scale factors to memory chip 400. For example, a power monitor may include current transformer interface 410 or a calibration device may include current transformer interface 410.

Current transformer interface 410 may include analog-to-digital converter (A/D) 420. A/D 420 may receive analog signals from the current transformers and produce a sequence of digital values (current transformer data or CT data) for further processing.

Current transformer interface 410 may include system on a chip (SoC) 430 that may receive the CT data from A/D 420. SoC 430 may further coordinate in receiving sensor data from the current transformers and reading or writing scale factors from memory chip 400. SoC 430 may include an enable pin or output that switches the current transformer interface 410 between reading sensor data and reading or writing scale factors. In some embodiments, the enable output may be connected to a multiplexor circuit, such as multiplexors 450, 450'. For example, where the enable output is 0, the multiplexors may be configured to send sensor data to A/D 420, and where the enable output is 1, the multiplexors may be configured to assist with reading from or writing to memory chip 400.

Current transformer interface 410 may include power and interface (I/F) circuit 440 to assist with reading from or writing to memory chip 400. For example, power and I/F circuit 440 may provide the power needed to perform a read or write operation and an interface to convert the scale factors stored on memory chip 400 into a format to be used by SoC 430.

Figure 4B:
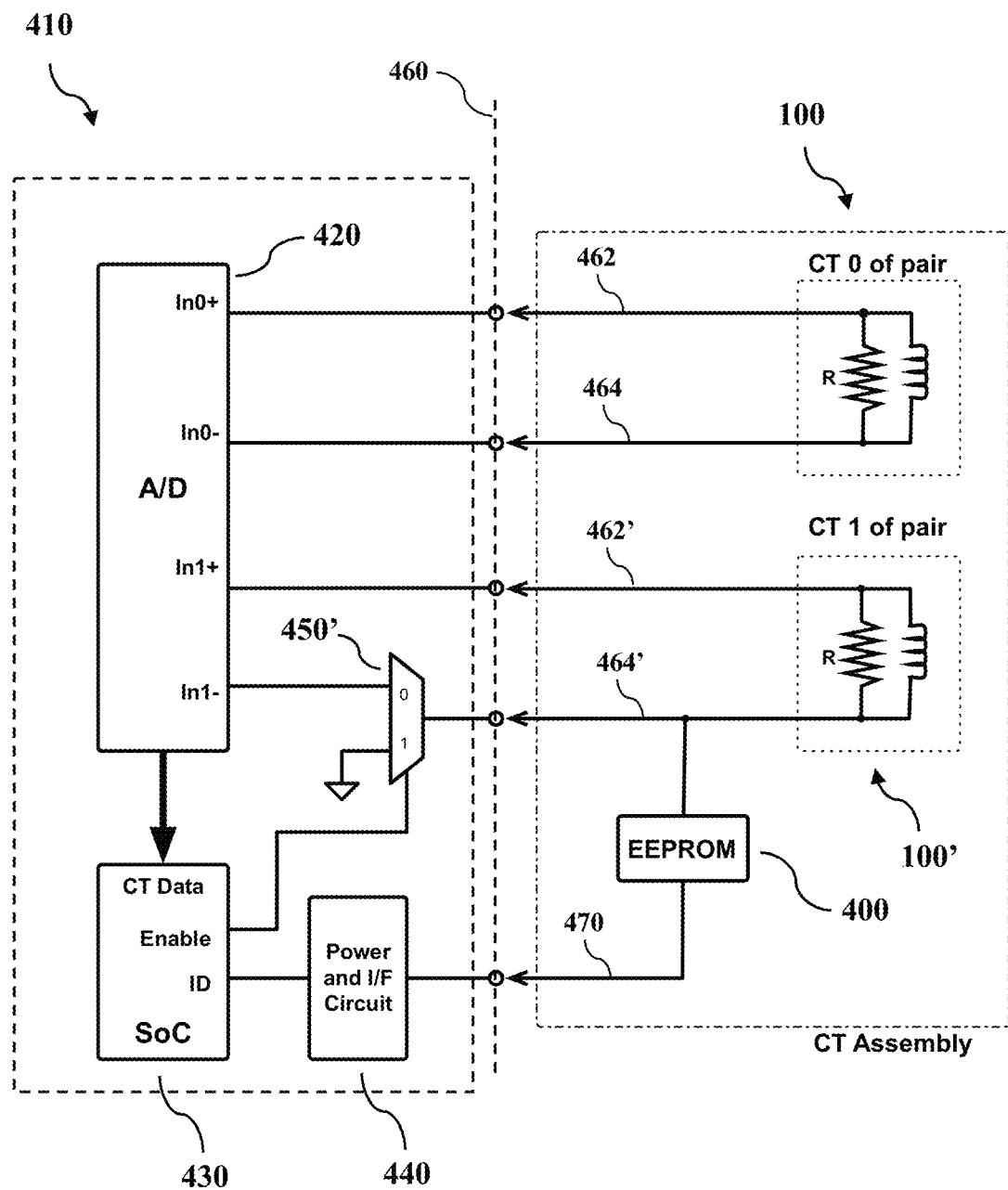
FIG. 4B illustrates an exemplary and non-limiting embodiment of a circuit diagram.

With reference to FIG. 4B, there is illustrated an exemplary and non-limiting embodiment of a circuit diagram of a current transformer assembly illustrating a first connection to the memory chip 400 attached to an existing negative wire 464' of the current transformer 100' and a second connection 470 to the memory chip 400 to the power and I/F circuit 440. In some embodiments, a positive wire may be utilized instead of negative wire for the first connection. In a non-limiting example, the current transformer interface 410 may be used to interface with the current transformer assembly 100' to obtain sensor readings or to configure the current transformer assembly through a first connection 462' and second connection 464', and the memory chip 400 is attached to the power and I/F circuit 440 by one of the first or second connections (e.g., negative wire connection 464', or in embodiments any of the wired connections to the current transformers 100 100') and by a third wire 470. Thus, the memory chip 400 would share one of the existing wire connections to the current transformers 100 100' and utilize an additional wired connection 470 to accommodate connectivity with the memory chip 400. As such, the wired connections through the connection interface 460 to the current transformer 100' and the memory chip 400 may include three wires (e.g., in addition to the two wires for the current transformer 100).

Figure 4C:
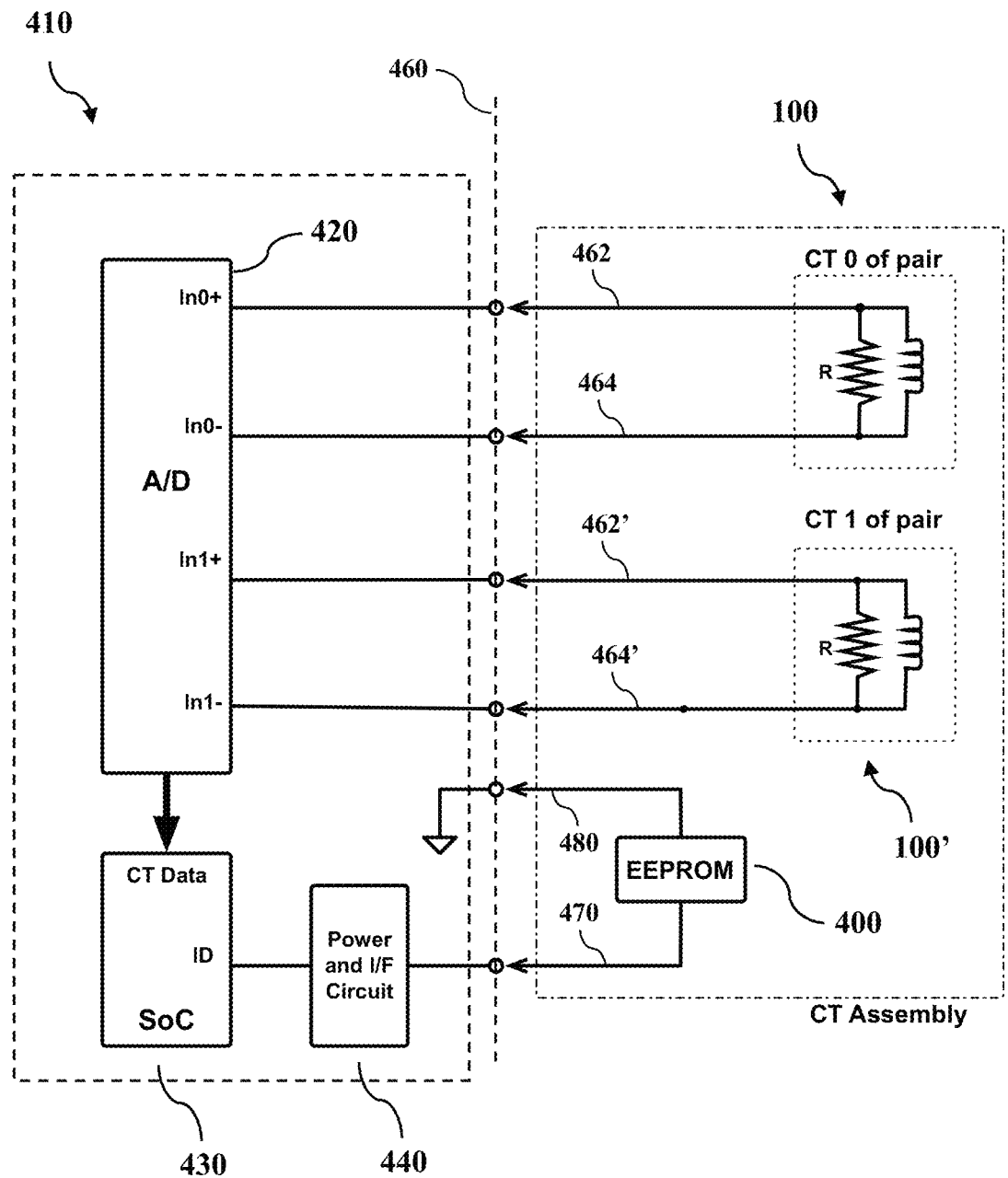
FIG. 4C illustrates an exemplary and non-limiting embodiment of a circuit diagram.

With reference to FIG. 4C, there is illustrated an exemplary and non-limiting embodiment of a circuit diagram of a current transformer assembly illustrating a first connection to the memory chip 400 attached to the power and I/F circuit 440 and a second connection to the memory chip 400 attached to a common connection point of the current transformer interface 410. In a non-limiting example, the current transformer interface 410 may be used to interface with the current transformer assembly 100' to obtain sensor readings or to configure the current transformer assembly through a first wire connection 462' and second wire connection 464', and the memory chip 400 is attached to the power and I/F circuit 440 by dedicated third connection wire 470 and fourth connection wire 480. Thus, the connections to the memory chip 400 may be independent of connections to the current transformers 100 100'. As such, the wired connections through the connection interface 460 to the current transformer 100' and the memory chip 400 may include four wires (e.g., in addition to the two wires for the current transformer 100).

Figure 5:
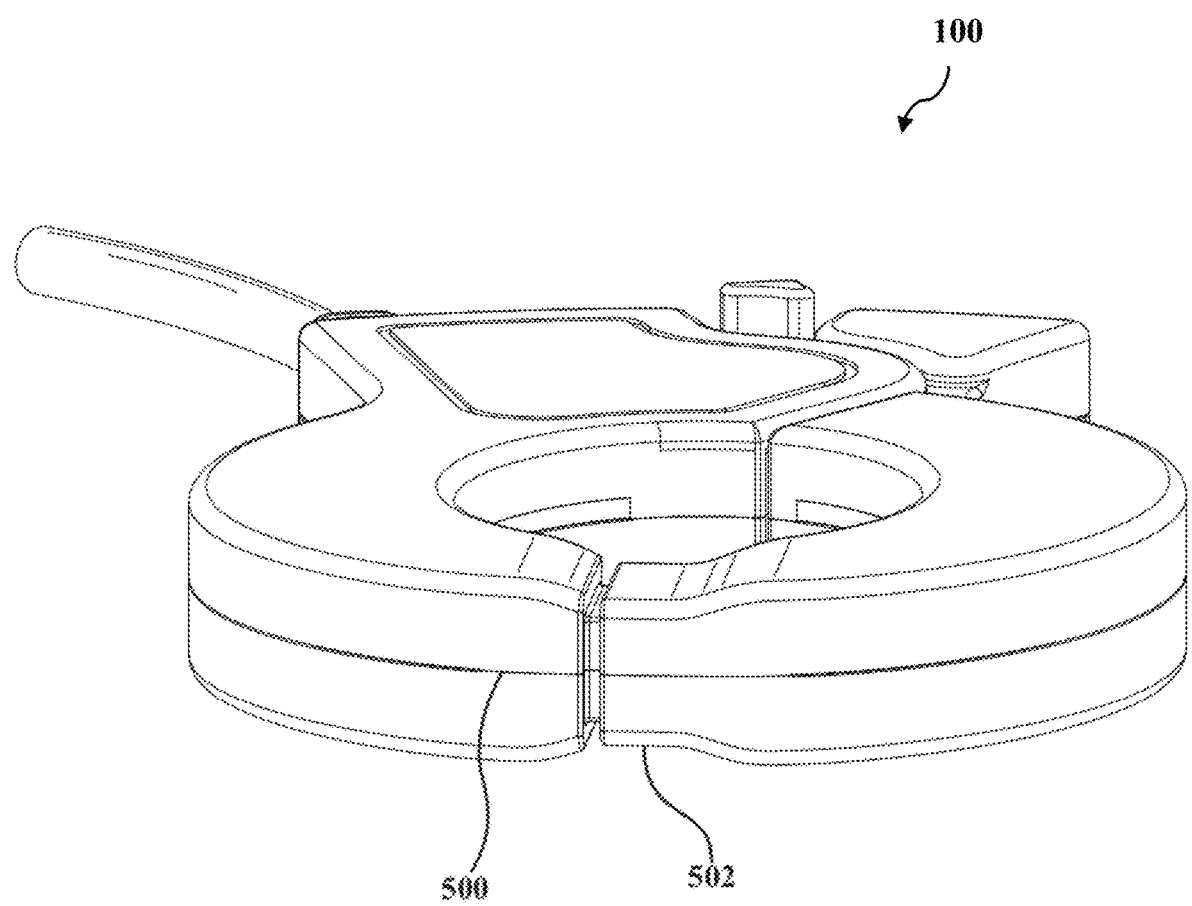
FIG. 5 illustrates an exemplary and non-limiting embodiment of a distal end of a current transformer.

With reference to FIG. 5, there is illustrated an exemplary and non-limiting embodiment of the distal end of a current transformer 100. As shown, two opposing distal ends 500, 502 are in contact with each other when the current transformer 100 in a closed position. Note that distal end 502 is tapered or dimpled with respect to opposing distal end 500. This reduced nose area of distal end 502 allows for a reduced height in this region to provide for increased manipulation and orientation in consumer electrical panels. With the core shape and oval design, the current transformer windings may be kept away from this region allowing the plastic shell to be reduced and create this advantageous shape. The interlocking nose pieces provide a shield to prevent exposing this inner core and their windings. In some instances, the tapering accommodates a known barrier/obstruction commonly present in electrical panels and/or solar junction panels.

Figure 6:
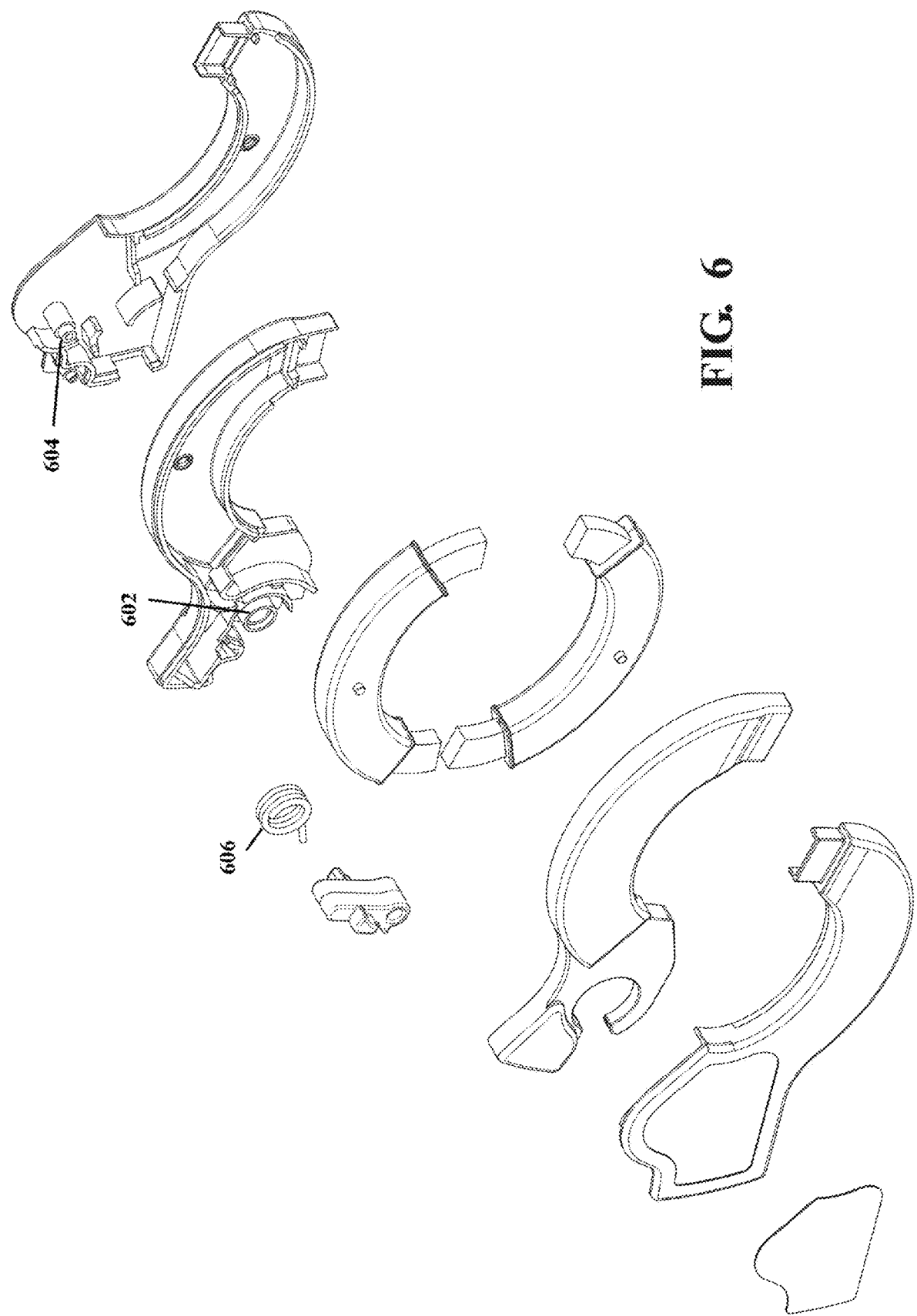
FIG. 6 illustrates an exemplary and non-limiting embodiment of an exploded view of a current transformer.

With reference to FIG. 6, there is disclosed an alternative embodiment for the hinge within the current transformer 100. In the illustrated embodiment, first hinge portion 602 is adapted to be inserted in rotational contact with second hinge portion 604 forming a hinge providing rotation of first housing 102 and second housing 104 about fulcrum point 106. The concentric circle style hinge is formed by concentrically located first hinge portion 602 and second hinge portion 604. In the embodiment of FIG. 6, the coil of spring 606 may be outside both first hinge portion 602 and second hinge portion 604.

Figure 7:
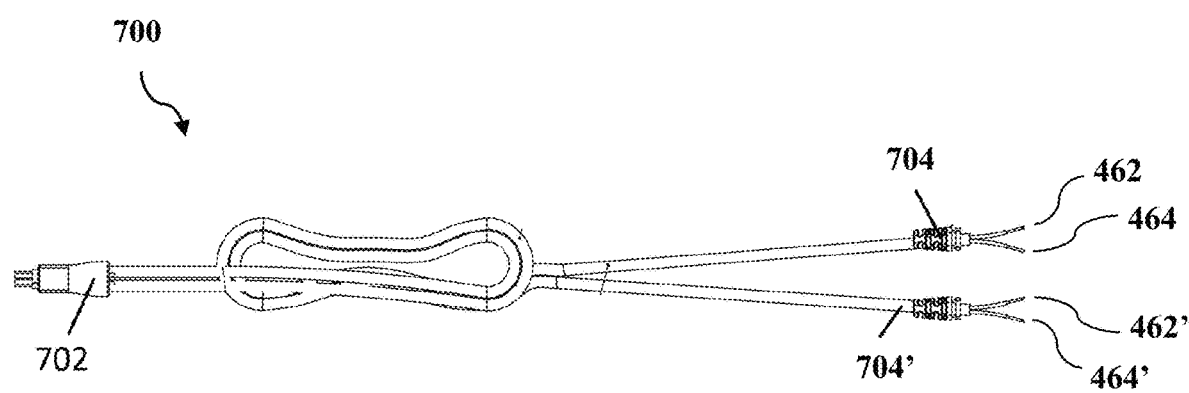
FIG. 7 illustrates an exemplary and non-limiting embodiment of a plug and cord for a current transformer assembly.

With reference to FIG. 7, there is disclosed an exemplary and non-limiting embodiment of a plug and cord 700 for implementation of the current interface 460 of a current transformer assembly. Plug 702 may be adapted to be plugged into a power monitor. First connection 704 may be connected to a first current transformer 100 (not shown) through wires 462, 464, and second connection 704' may be connected to a second current transformer 100' (not shown) through wires 462', 464'. In some embodiments, a current transformer assembly may have a single current transformer (and thus a single cord and connection, e.g., 462, 464), and in some embodiments, a current transformer assembly may have more than two current transformers (and thus more than two cords and connections 462, 464, 462', 464'). Where a current transformer assembly includes memory chip 400, memory chip 400 may be situated in any appropriate location. In some embodiments, memory chip 400 may be situated within the plug 702. As described herein, the memory chip 400 may connect to some combination of the existing connections 462, 464, 462', 464' of the current transformers 100, 100', to one of the existing connections 462, 464, 462', 464' of the current transformers 100, 100' and an additional dedicated connection 470 (additional wire not shown), or to dedicated connections 470, 480 (additional wires not shown).

While only a few embodiments of the present disclosure have been shown and described, it will be obvious to those skilled in the art that many changes and modifications may be made thereunto without departing from the spirit and scope of the present disclosure as described in the following claims. All patent applications and patents, both foreign and domestic, and all other publications referenced herein are incorporated herein in their entireties to the full extent permitted by law.

The methods and systems described herein may be deployed in part or in whole through a machine that executes computer software, program codes, and/or instructions on a processor. The present disclosure may be implemented as a method on the machine, as a system or apparatus as part of or in relation to the machine, or as a computer program product embodied in a computer readable medium executing on one or more of the machines. In embodiments, the processor may be part of a server, cloud server, client, network infrastructure, mobile computing platform, stationary computing platform, or other computing platform. A processor may be any kind of computational or processing device capable of executing program instructions, codes, binary instructions and the like. The processor may be or may include a signal processor, digital processor, embedded processor, microprocessor or any variant such as a co-processor (math co-processor, graphic co-processor, communication co-processor and the like) and the like that may directly or indirectly facilitate execution of program code or program instructions stored thereon. In addition, the processor may enable execution of multiple programs, threads, and codes. The threads may be executed simultaneously to enhance the performance of the processor and to facilitate simultaneous operations of the application. By way of implementation, methods, program codes, program instructions and the like described herein may be implemented in one or more thread. The thread may spawn other threads that may have assigned priorities associated with them; the processor may execute these threads based on priority or any other order based on instructions provided in the program code. The processor, or any machine utilizing one, may include non-transitory memory that stores methods, codes, instructions and programs as described herein and elsewhere. The processor may access a non-transitory storage medium through an interface that may store methods, codes, and instructions as described herein and elsewhere. The storage medium associated with the processor for storing methods, programs, codes, program instructions or other type of instructions capable of being executed by the computing or processing device may include but may not be limited to one or more of a CD-ROM, DVD, memory, hard disk, flash drive, RAM, ROM, cache and the like.

A processor may include one or more cores that may enhance speed and performance of a multiprocessor. In embodiments, the process may be a dual core processor, quad core processors, other chip-level multiprocessor and the like that combine two or more independent cores to provide speed improvements.

The methods and systems described herein may be deployed in part or in whole through a machine that executes computer software on a server, client, firewall, gateway, hub, router, or other such computer and/or networking hardware. The software program may be associated with a server that may include a file server, print server, domain server, internet server, intranet server, cloud server, and other variants such as secondary server, host server, distributed server and the like. The server may include one or more of memories, processors, computer readable media, storage media, ports (physical and virtual), communication devices, and interfaces capable of accessing other servers, clients, machines, and devices through a wired or a wireless medium, and the like. The methods, programs, or codes as described herein and elsewhere may be executed by the server. In addition, other devices required for execution of methods as described in this application may be considered as a part of the infrastructure associated with the server.

The server may provide an interface to other devices including, without limitation, clients, other servers, printers, database servers, print servers, file servers, communication servers, distributed servers, social networks, and the like. Additionally, this coupling and/or connection may facilitate remote execution of program across the network. The networking of some or all of these devices may facilitate parallel processing of a program or method at one or more location without deviating from the scope of the disclosure. In addition, any of the devices attached to the server through an interface may include at least one storage medium capable of storing methods, programs, code and/or instructions. A central repository may provide program instructions to be executed on different devices. In this implementation, the remote repository may act as a storage medium for program code, instructions, and programs.

The software program may be associated with a client that may include a file client, print client, domain client, internet client, intranet client and other variants such as secondary client, host client, distributed client and the like. The client may include one or more of memories, processors, computer readable media, storage media, ports (physical and virtual), communication devices, and interfaces capable of accessing other clients, servers, machines, and devices through a wired or a wireless medium, and the like. The methods, programs, or codes as described herein and elsewhere may be executed by the client. In addition, other devices required for execution of methods as described in this application may be considered as a part of the infrastructure associated with the client.

The client may provide an interface to other devices including, without limitation, servers, other clients, printers, database servers, print servers, file servers, communication servers, distributed servers and the like. Additionally, this coupling and/or connection may facilitate remote execution of program across the network. The networking of some or all of these devices may facilitate parallel processing of a program or method at one or more location without deviating from the scope of the disclosure. In addition, any of the devices attached to the client through an interface may include at least one storage medium capable of storing methods, programs, applications, code and/or instructions. A central repository may provide program instructions to be executed on different devices. In this implementation, the remote repository may act as a storage medium for program code, instructions, and programs.

The methods and systems described herein may be deployed in part or in whole through network infrastructures. The network infrastructure may include elements such as computing devices, servers, routers, hubs, firewalls, clients, personal computers, communication devices, routing devices and other active and passive devices, modules and/or components as known in the art. The computing and/or non-computing device(s) associated with the network infrastructure may include, apart from other components, a storage medium such as flash memory, buffer, stack, RAM, ROM and the like. The processes, methods, program codes, instructions described herein and elsewhere may be executed by one or more of the network infrastructural elements. The methods and systems described herein may be adapted for use with any kind of private, community, or hybrid cloud computing network or cloud computing environment, including those which involve features of software as a service (SaaS), platform as a service (PaaS), and/or infrastructure as a service (IaaS).

The methods, program codes, and instructions described herein and elsewhere may be implemented on a cellular network has sender-controlled contact media content item multiple cells. The cellular network may either be frequency division multiple access (FDMA) network or code division multiple access (CDMA) network. The cellular network may include mobile devices, cell sites, base stations, repeaters, antennas, towers, and the like. The cell network may be a GSM, GPRS, 3G, EVDO, mesh, or other networks types.

The methods, program codes, and instructions described herein and elsewhere may be implemented on or through mobile devices. The mobile devices may include navigation devices, cell phones, mobile phones, mobile personal digital assistants, laptops, palmtops, netbooks, pagers, electronic books readers, music players and the like. These devices may include, apart from other components, a storage medium such as a flash memory, buffer, RAM, ROM and one or more computing devices. The computing devices associated with mobile devices may be enabled to execute program codes, methods, and instructions stored thereon. Alternatively, the mobile devices may be configured to execute instructions in collaboration with other devices. The mobile devices may communicate with base stations interfaced with servers and configured to execute program codes. The mobile devices may communicate on a peer-to-peer network, mesh network, or other communications network. The program code may be stored on the storage medium associated with the server and executed by a computing device embedded within the server. The base station may include a computing device and a storage medium. The storage device may store program codes and instructions executed by the computing devices associated with the base station.

The computer software, program codes, and/or instructions may be stored and/or accessed on machine readable media that may include: computer components, devices, and recording media that retain digital data used for computing for some interval of time; semiconductor storage known as random access memory (RAM); mass storage typically for more permanent storage, such as optical discs, forms of magnetic storage like hard disks, tapes, drums, cards and other types; processor registers, cache memory, volatile memory, non-volatile memory; optical storage such as CD, DVD; removable media such as flash memory (e.g. USB sticks or keys), floppy disks, magnetic tape, paper tape, punch cards, standalone RAM disks, Zip drives, removable mass storage, off-line, and the like; other computer memory such as dynamic memory, static memory, read/write storage, mutable storage, read only, random access, sequential access, location addressable, file addressable, content addressable, network attached storage, storage area network, bar codes, magnetic ink, and the like.

The methods and systems described herein may transform physical and/or or intangible items from one state to another. The methods and systems described herein may also transform data representing physical and/or intangible items from one state to another.

The elements described and depicted herein, including in flow charts and block diagrams throughout the figures, imply logical boundaries between the elements. However, according to software or hardware engineering practices, the depicted elements and the functions thereof may be implemented on machines through computer executable media has sender-controlled contact media content item a processor capable of executing program instructions stored thereon as a monolithic software structure, as standalone software modules, or as modules that employ external routines, code, services, and so forth, or any combination of these, and all such implementations may be within the scope of the present disclosure. Examples of such machines may include, but may not be limited to, personal digital assistants, laptops, personal computers, mobile phones, other handheld computing devices, medical equipment, wired or wireless communication devices, transducers, chips, calculators, satellites, tablet PCs, electronic books, gadgets, electronic devices, devices has sender-controlled contact media content item artificial intelligence, computing devices, networking equipment, servers, routers and the like. Furthermore, the elements depicted in the flow chart and block diagrams or any other logical component may be implemented on a machine capable of executing program instructions. Thus, while the foregoing drawings and descriptions set forth functional aspects of the disclosed systems, no particular arrangement of software for implementing these functional aspects should be inferred from these descriptions unless explicitly stated or otherwise clear from the context. Similarly, it will be appreciated that the various steps identified and described above may be varied, and that the order of steps may be adapted to particular applications of the techniques disclosed herein. All such variations and modifications are intended to fall within the scope of this disclosure. As such, the depiction and/or description of an order for various steps should not be understood to require a particular order of execution for those steps, unless required by a particular application, or explicitly stated or otherwise clear from the context.

The methods and/or processes described above, and steps associated therewith, may be realized in hardware, software or any combination of hardware and software suitable for a particular application. The hardware may include a general-purpose computer and/or dedicated computing device or specific computing device or particular aspect or component of a specific computing device. The processes may be realized in one or more microprocessors, microcontrollers, embedded microcontrollers, programmable digital signal processors or other programmable device, along with internal and/or external memory. The processes may also, or instead, be embodied in an application specific integrated circuit, a programmable gate array, programmable array logic, or any other device or combination of devices that may be configured to process electronic signals. It will further be appreciated that one or more of the processes may be realized as a computer executable code capable of being executed on a machine-readable medium.

The computer executable code may be created using a structured programming language such as C, an object oriented programming language such as C++, or any other high-level or low-level programming language (including assembly languages, hardware description languages, and database programming languages and technologies) that may be stored, compiled or interpreted to run on one of the above devices, as well as heterogeneous combinations of processors, processor architectures, or combinations of different hardware and software, or any other machine capable of executing program instructions.

Thus, in one aspect, methods described above and combinations thereof may be embodied in computer executable code that, when executing on one or more computing devices, performs the steps thereof. In another aspect, the methods may be embodied in systems that perform the steps thereof, and may be distributed across devices in a number of ways, or all of the functionality may be integrated into a dedicated, standalone device or other hardware. In another aspect, the means for performing the steps associated with the processes described above may include any of the hardware and/or software described above. All such permutations and combinations are intended to fall within the scope of the present disclosure.

While the disclosure has been disclosed in connection with the preferred embodiments shown and described in detail, various modifications and improvements thereon will become readily apparent to those skilled in the art. Accordingly, the spirit and scope of the present disclosure is not to be limited by the foregoing examples, but is to be understood in the broadest sense allowable by law.

The use of the terms "a" and "an" and "the" and similar referents in the context of describing the disclosure (especially in the context of the following claims) is to be construed to cover both the singular and the plural, unless otherwise indicated herein or clearly contradicted by context. The terms "comprising," "has sender-controlled contact media content item," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the disclosure and does not pose a limitation on the scope of the disclosure unless otherwise claimed. No language in the specification should be construed as indicating any non-claimed element as essential to the practice of the disclosure.

While the foregoing written description enables one of ordinary skill to make and use what is considered presently to be the best mode thereof, those of ordinary skill will understand and appreciate the existence of variations, combinations, and equivalents of the specific embodiment, method, and examples herein. The disclosure should therefore not be limited by the above described embodiment, method, and examples, but by all embodiments and methods within the scope and spirit of the disclosure.

All documents referenced herein are hereby incorporated by reference.

What is claimed is:

1. A current transformer comprising:
a first housing comprising a first handle portion and a first distal portion;
a second housing comprising a second handle portion and a second distal portion;
a first core having a first proximal core end and a first distal core end, the first core mounted in rotational contact within the first distal portion; and
a second core having a second proximal core end and a second distal core end, the second core mounted in rotational contact within the second distal portion;
wherein the first housing is rotationally coupled to the second housing about a fulcrum point and wherein, when the first housing and the second housing are rotated into a closed position, the first core is adapted to rotate within the first distal portion and the second core is adapted to rotate within the second distal portion to enable contact between the first proximal core end and the second proximal core end and to enable contact between the first distal core end and the second distal core end.

2. The current transformer of claim 1, wherein a pivot member is attached to the first core and the first housing comprises an indentation to receive the pivot member.

3. The current transformer of claim 1, wherein a pivot member is attached to the first housing and the first core comprises an indentation to receive the pivot member.

4. The current transformer of claim 1, wherein there is a gap between the first housing and the first core.

5. The current transformer of claim 1, wherein the first housing has a semi-elliptical shape.

6. The current transformer of claim 1, wherein a ratio of (i) a distance between the fulcrum point and an end of the first distal portion and (ii) a distance between the fulcrum point and an end of the first handle portion is at least 5 to 1.

7. The current transformer of claim 1, wherein a ratio of (i) a distance between the fulcrum point and an end of the first distal portion and (ii) a distance between the fulcrum point and an end of the first handle portion is at least 7 to 1.

8. The current transformer of claim 1, wherein a maximum thickness of the first housing is less than or equal to 11 millimeters.

9. The current transformer of claim 1, comprising:
a lock attached to the second handle portion and adapted to rotate about an axis;
wherein the lock is adapted to rotate about the axis into contact with the first handle portion preventing rotation of the first housing and the second housing about the fulcrum point.

10. The current transformer of claim 9, wherein the lock is made of plastic.

11. The current transformer of claim 1, comprising a memory chip adapted to store a first scale factor of the first core and a second scale factor of the second core.

12. A current sensing device comprising:
a current transformer for sensing a current in an alternating current (AC) power line, the current transformer comprising:
a first housing comprising a first handle portion and a first distal portion;
a second housing comprising a second handle portion and a second distal portion;
a first core having a first proximal core end and a first distal core end, the first core mounted in rotational contact within the first distal portion, wherein the first core is wrapped with a first conductor winding; and
a second core having a second proximal core end and a second distal core end, the second core mounted in rotational contact within the second distal portion, wherein the second core is wrapped with a second conductor winding;
wherein the first housing is rotationally coupled to the second housing about a fulcrum point and wherein, when the first housing and the second housing are rotated into a closed position, the first core is adapted to rotate within the first distal portion and the second core is adapted to rotate within the second distal portion to enable contact between the first proximal core end and the second proximal core end and to enable contact between the first distal core end and the second distal core end.

13. The current sensing device of claim 12, wherein a pivot member is attached to the first core and the first housing comprises an indentation to receive the pivot member.

14. The current sensing device of claim 12, wherein a pivot member is attached to the first housing and the first core comprises an indentation to receive the pivot member.

15. The current sensing device of claim 12, wherein there is a gap between the first housing and the first core.

16. The current sensing device of claim 12, wherein the first housing has a semi-elliptical shape.

17. The current sensing device of claim 12, wherein a ratio of (i) a distance between the fulcrum point and an end of the first distal portion and (ii) a distance between the fulcrum point and an end of the first handle portion is 5 to 1 or 7 to 1.

18. The current sensing device of claim 12, wherein a maximum thickness of the first housing is less than or equal to 11 millimeters.

19. The current sensing device of claim 12, comprising:
- a lock attached to the second handle portion and adapted to rotate about an axis;
- wherein the lock is adapted to rotate about the axis into contact with the first handle portion preventing rotation of the first housing and the second housing about the fulcrum point.

20. The current sensing device of claim 12, comprising a memory chip adapted to store a first scale factor of the first core and a second scale factor of the second core.

\* \* \* \* \*